(12) United States Patent
Demiryont

(10) Patent No.: US 11,791,096 B1
(45) Date of Patent: Oct. 17, 2023

(54) METAMATERIAL OXIDE CAPACITOR

(71) Applicant: Hulya Demiryont, Saint Petersburg, FL (US)

(72) Inventor: Hulya Demiryont, Saint Petersburg, FL (US)

(*) Notice: Subject to any disclaimer, the term of this patent is extended or adjusted under 35 U.S.C. 154(b) by 0 days.

(21) Appl. No.: 18/189,053

(22) Filed: Mar. 23, 2023

(51) Int. Cl.
| | | |
|---|---|---|
| H01G 4/10 | (2006.01) | |
| H01G 4/005 | (2006.01) | |
| H01G 4/08 | (2006.01) | |
| H01G 4/12 | (2006.01) | |
| H01L 49/02 | (2006.01) | |

(52) U.S. Cl.
CPC ............ *H01G 4/10* (2013.01); *H01G 4/005* (2013.01); *H01G 4/085* (2013.01); *H01G 4/12* (2013.01); *H01G 4/1209* (2013.01); *H01G 4/1218* (2013.01); *H01G 4/1254* (2013.01); *H01L 28/56* (2013.01); *H01L 28/55* (2013.01)

(58) Field of Classification Search
CPC ...... H01L 28/55–56; H01G 4/10; H01G 4/12; H01G 4/1209; H01G 4/1218; H01G 4/1254; H01G 4/1263; H01G 4/005; H01G 4/085
See application file for complete search history.

(56) References Cited

U.S. PATENT DOCUMENTS

| | | | | |
|---|---|---|---|---|
| 6,943,392 B2* | 9/2005 | Agarwal | ............... | H01L 28/55 257/295 |
| 10,948,628 B1 | 3/2021 | Demiryont | | |
| 2010/0315760 A1* | 12/2010 | Krishnan | ............... | H01G 4/10 361/313 |

OTHER PUBLICATIONS

Jun Zheng et al., Permittivity acquisition of plasmonic materials at epsilon near zero wavelengths., J. Appl. Phys. 129 103101 (2021).
Ding et al., High-performance MIM capacitor using ALD high-k HfO2-Al2O3 laminate dielectrics. IEEE Letters 24,12, (2003), 730-732.
P. Katiyar et. All., "electrical properties of amorphous aluminum oxide films", Acta Materialia, V 53,2617,(2005).
Roy Bardhan et. All., "Electron transport mechanisms in very thin Al2O3 films" International Journal of electronics , 40, 313,(1976).
A. Rahman et. All., "Electrical characterization of rf sputtered Al2O3 MIM structures", Solid State Films 71, 7,(1980).

(Continued)

*Primary Examiner* — Jose R Diaz
(74) *Attorney, Agent, or Firm* — BakerHostetler

(57) ABSTRACT

A capacitor may comprise a substrate and a first electrically conductive electrode layer. A metal oxide layer may be deposited on at least one of the substrate or the first electrically conductive electrode layer. A proximal region of the metal oxide may comprise a stoichiometric, dielectric, oxygen vacancy-free portion of the metal oxide. The proximal region may be in communication with the first electrically conductive electrode layer. A distal region of the metal oxide may comprise a constant oxygen vacancy portion. The distal region may be in communication with a second electrically conductive electrode layer. The metal oxide may comprise a gradient region comprising a substantially stoichiometric metal oxide portion and a substantially constant oxygen vacancy portion. The gradient region may comprise an increasing oxygen vacancy gradient from the proximal region to the distal region. The second electrically conductive electrode layer may be deposited on the distal region.

30 Claims, 19 Drawing Sheets

(Cross Section)

(Depth)

(56) References Cited

OTHER PUBLICATIONS

Hulya Birey "Dielectric properties of aluminum oxide films" Journal of Applied Physics 49, 2898-2904 (1978).
Hulya Birey "Thickness dependence of dielectric constant and resistance of Al2O3 films" Journal of Applied Physics 48, 5209-5212 (1977).
Chang et al., Resistance random access memory, Materials Today, vol. 19, No. 5, Jun. 2016, 254-264.
Bawa et al., Resistive switching in transition metal oxides, Materials Today, vol. 11, No. 6, Jun. 2008, 28-36.
Nigo et al., Conduction band caused by oxygen vacancies in aluminum oxide for resistance random access memory, J. Appl. Phys. 112, 033711 (2012).
Tong et al., Electrically programmable magnetoresistance in AlO x-based magnetic tunnel junctions, Nature portfolio, scientific reports, 11:6027, 2021, 7 pages.
Speier et al., Chapter Four—Nature of the Resistive Switching Phenomena in TiO2 and SrTiO3: Origin of the Reversible Insulator—Metal Transition, Solid state physics, vol. 65, 2014, 353-559.
Mironov et al., Supercapacitance and superinductance of TiN and NbTiN films in the vicinity of superconductor-to-insulator transition www.nature.com/scientificreports, (2021) 11:16181 | https://doi.org/10.1038/s41598-021-95530-5.
Homes, C. et al., Optical response of high dielectric constant perovskite related oxide, Science 293, 673-676 (2001).
Wanbiao Hu, et al., Electron-pinned defect-dipoles for high-performance colossal permittivity materials, Nature Materials vol. 12, pp. 821-826 (2013).
Hess et al., Giant dielectric constants at the approach to the insulator-metal transition. Phys. Rev. B 25(8), 5578-5580, Published Apr. 15, 1982.
Garcia, et al., Zero permittivity materials: Band gaps at the visible, Appl. Phys. Lett. 80(7), 1120 (2002); https://doi.org/10.1063/1.1449529.
Mikio Fukuhara et All., Amorphous titanium-oxide supercapacitors, Nature scientific reports 2016 11, 6 p. 35870.
Julia Zotova et al., Compact Superconducting Microwave Resonators Based on Al-AlOx-Al Capacitors, Phys. Rev. Applied 19 (2023) 4, 044067, 11 pages.
Hulya Birey "High-field transport properties of aluminum embedded aluminum oxide films" Journal Appl. Physics letters vol. 23,315(1973).
Shamala et al., Studies on Optical and dielectric properties of Al2O3 thin films prepared by electron beam evaporation and spray pyrolysis method, Material Science and Engineering, B 106 269-274 (2004).

* cited by examiner

● Al
○ O
□ Oxygen Vacancy
⊞ ++ Charged O Vacancy with
−− Confined Electrons (Cross Section)

(Depth)

METAMATERIAL OXIDE CAPACITOR

TECHNICAL FIELD

The present disclosure relates to the field of plasmonic capacitors.

BACKGROUND

Oxygen vacancies play crucial roles in determining the physical properties of metal oxides, representing important building blocks in many scientific and technological fields due to the unique chemical and physical properties of such metal oxides, including in electronic and optical applications. However, oxygen vacancies are often invisible because of the dilute concentrations of such oxygen vacancies. Therefore, characterizing and controlling the presence of oxygen vacancies is important for understanding and realizing functional metal oxide devices.

SUMMARY

Oxygen vacancies play crucial roles in determining the physical properties of metal oxides, representing important building blocks in many scientific and technological fields due to the unique chemical and physical properties of such metal oxides, including in electronic and optical applications. However, oxygen vacancies are often invisible because of the dilute concentrations of such oxygen vacancies. Therefore, characterizing and controlling the presence of oxygen vacancies is important for understanding and realizing functional metal oxide devices.

In the present disclosure it is shown that supercapacitors are formed because of "self-doped Aluminum oxide generated dipoles by positive charged oxygen vacancy and its electrons" that formed by oxygen deficiency-profile-thicknesses and related formed dipoles. Active capacitors may form when vacancy concentration in a constant vacancy region reaches a critical concentration where vacancy hopping conduction may take place. A function of a two-layer interface is described, comprising $Al_2O_3$ "insulating" film and "vacancy-gradient-film" with gradually increasing vacancy. The vacancy-gradient-film may cause a negative capacitance region to be created. Vacancy hopping conduction occurs when oxygen vacancy level reaches a critical concentration in the "oxygen-vacancy constant" layer.

"Charge neutrality" exists in the capacitances shown herein because each oxygen vacancy created by one missing oxygen that provides two positive charges by leaving two electrons that confine in oxide. Vacancy and confined electrons may form dipoles, acting like electric springs because vacancy can respond to an electrical field but confined electrons may not response to the electric field. Vacancy carries positive charge because of each missing oxygen and the associated electrons confined in the oxide.

$Al_2O_3$ and $AlOx$ oxides are used herein in parallel plate oxide capacitors (PPOC). Capacitors are formed with stoichiometric $Al_2O_3$ and oxygen deficient $AlOx$ films. During oxide deposition there is an extra glass substrate to evaluate optical performance of oxides. In a critical oxygen deficient oxide condition $AlO^*x$ plasmonic film and plasmonic parallel plate $PPAlOx^*$ capacitors are obtained. Plasmonic oxide capacitors are active capacitors responding to bias voltage and RF frequencies, exhibiting insulator to conductor resistive switches. Plasmonic capacitors are tunable switchable-voltage-controlled supercapacitors.

DETAILED DESCRIPTION

Figure 1:
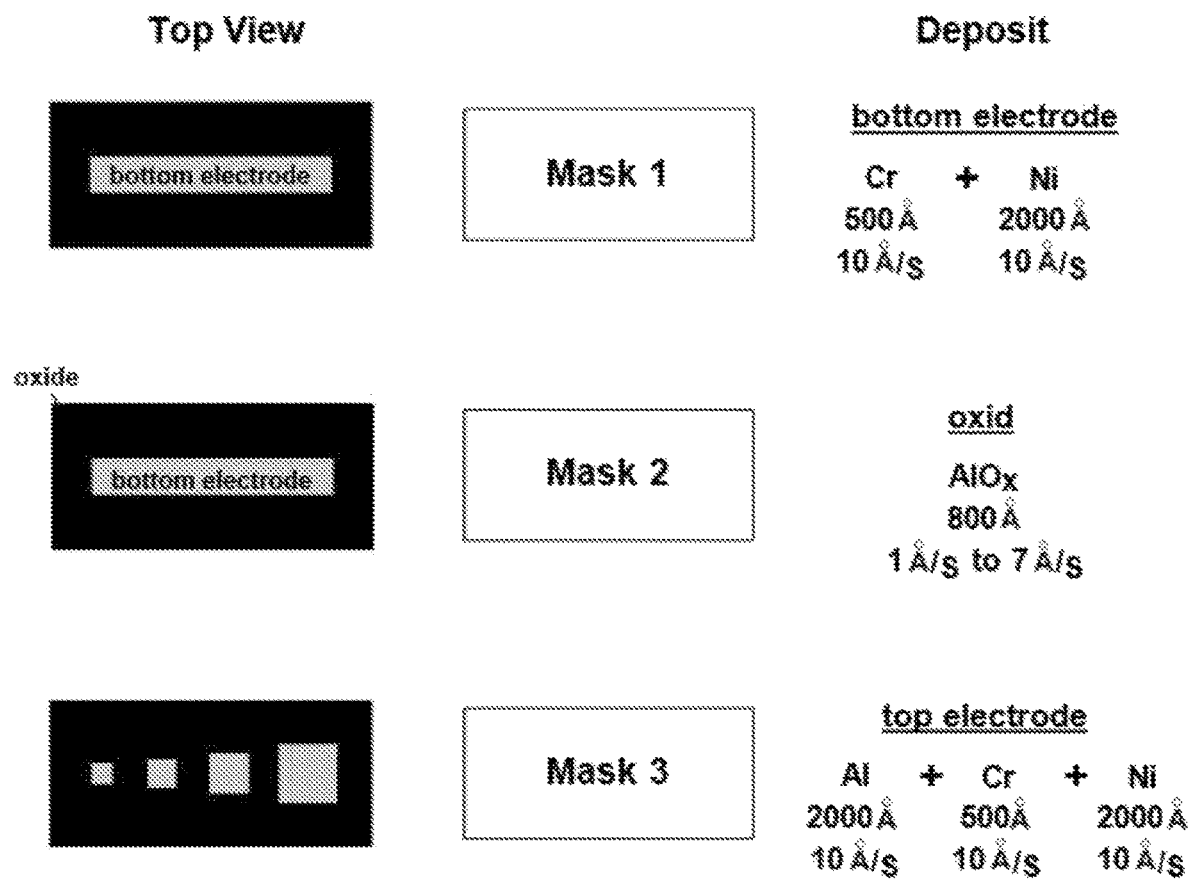
FIG. 1 shows an example thin film deposition process.

The present disclosure may be understood more readily by reference to the following detailed description of desired embodiments and the examples included therein.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing. All publications, patent applications, patents and other references mentioned herein are incorporated by reference in their entirety. The materials, methods, and examples disclosed herein are illustrative only and not intended to be limiting.

The singular forms "a," "an," and "the" include plural referents unless the context clearly dictates otherwise.

As used in the specification and in the claims, the term "comprising" can include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any impurities that might result therefrom, and excludes other ingredients/steps.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

Unless indicated to the contrary, the numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently of the endpoints. The endpoints of the ranges and any values disclosed herein are not limited to the precise range or value; they are sufficiently imprecise to include values approximating these ranges and/or values.

As used herein, approximating language can be applied to modify any quantitative representation that can vary without resulting in a change in the basic function to which it is related. Accordingly, a value modified by a term or terms, such as "about" and "substantially," may not be limited to the precise value specified, in some cases. In at least some instances, the approximating language can correspond to the precision of an instrument for measuring the value. The modifier "about" should also be considered as disclosing the range defined by the absolute values of the two endpoints. For example, the expression "from about 2 to about 4" also discloses the range "from 2 to 4." The term "about" can refer to plus or minus 10% of the indicated number. For example, "about 10%" can indicate a range of 9% to 11%, and "about 1" can mean from 0.9-1.1. Other meanings of "about" can be apparent from the context, such as rounding off, so, for example "about 1" can also mean from 0.5 to 1.4. Further, the term "comprising" should be understood as having its open-ended meaning of "including," but the term also includes the closed meaning of the term "consisting." For example, a composition that comprises components A and B can be a composition that includes A, B, and other components, but can also be a composition made of A and B only. Any documents cited herein are incorporated by reference in their entireties for any and all purposes.

As may be understood, oxygen vacancies play crucial roles in determining the physical properties of metal oxides, representing important building blocks in many scientific and technological fields due to the unique chemical and physical properties of such metal oxides, including in electronic and optical applications. However, oxygen vacancies are often invisible because of the dilute concentrations of such oxygen vacancies. Therefore, characterizing and controlling the presence of oxygen vacancies is important for understanding and realizing functional metal oxide devices.

The present disclosure focused on the relevant regimes of concentrations and associated phenomena arising from oxygen vacancies. Focus is spent on experimental techniques available for observing oxygen vacancies at widely different levels of concentrations. It may be shown that the measurement and evaluation of "dielectric permittivity spectrum" in broadly different vacancy concentration provides selection of a vacancy region of Aluminum oxide exhibiting insulator to conductor transitions. The present disclosure further analyzes why the described capacitors are supercapacitors, how a voltage-controlled supercapacitor may be made, how to improve charge storage capabilities of an oxide capacitor, effects of interfaces, for example in Aluminum oxide supercapacitors. Finally, challenges and opportunities are discussed for utilizing the applications of oxygen vacancies in metal oxides specifically in aluminum oxide from a THz (Exp 12 Hz) optical region (Exp 14 Hz) to a few KHz (Exp 3 Hz) electronic regions. This work correlates/combines material interaction with electromagnetic waves from visible to near DC.

The rapid progress achieved in semiconductor nanotechnology by doping of material and dopants, relies on the control of materials themselves and on the success in understanding and controlling the defects in such materials. Similar improvements are expected in semiconductor technology by doping of semiconductors, for example in oxygen vacancies comprising metal oxide cases, by selecting metal oxide and self-doping of the metal oxides with their oxygen vacancies as described herein. Aluminum oxide is discussed in detail herein, and the Aluminum oxide is self-doped with oxygen vacancies with controlled density, to achieve a voltage-controlled all solid state plasmonic supercapacitor, exhibiting multiple metal-insulator transitions in the voltage-controlled permittivity spectra at plasmonic resonance frequencies of oxides.

Few, if any, studies exist on materials on low temperature, low frequency region switching from an insulator to conductor. For example, Titanium Nitride (TiN) and Niobium Titanium Nitride (NbTiN) films may show a superconductor to insulator transition in the frequency region of 400 Hz-1 MHZ.

There are some similar facts on insulator-metal transitions observed on phosphorus doped Silicon (Si) at a 400 MHz region at very low temperatures, for example millikelvin.

Recently, work has commenced on giant permittivity or colossal permittivity materials, for example TiN and NbTiN films show superconductor to insulator transitions in the frequency region of 400 Hz-1 MHZ. Additional work is ongoing on materials at low temperature, low frequency region switching from an insulator to a conductor. Measurements have been made for the real and imaginary parts of the dielectric permittivity of insulating samples of P-doped Si at millikelvin temperatures at 400 MHz using a resonant transmission cavity. Such analysis describes that the real part of the dielectric permittivity is enhanced by more than two orders of magnitude over the isolated donor polarizability and determine the exponent which describes the critical divergence of the real part at the insulator-metal transition by fitting the temperature dependence of the corresponding imaginary part. The form of the observed divergence remains unexplained theoretically.

Additional work may describe Nb and Indium (In) co-doped $TiO_2$ rutile colossal permittivity materials. The observed high storage capacity of the material may be explained by the material forming large defect-dipoles clusters containing high localized electrons. Additional work on a ternary compound having colossal permittivity material exhibiting very high capacitance having dipoles formed by electron pinned defect in (Nb+In) co-doped $TiO_2$ rutile films. The colossal permittivity materials, for example Nb+In in $TiO_2$ measured values that are up to $10^6$. Such permittivity is attributed to charge-carrier polarization.

$CaCu_3Ti_4O_{12}$ perovskite is another material described where permittivity of the oxide changes from 80 at THz and increases with reducing frequency to Exp 5 in decreasing frequencies down to the KHz range. The present disclosure presents a strategy to design a new type of colossal permittivity (CP) material. One line of research is to deliberately create local electron-pinned defect-dipoles within a parent metal oxide in such a way that the pinned electron is localized within a few metal-oxygen polyhedra. As these electrons have significantly more space for displacement than atomic electrons, the resultant defect-dipoles are large and behave like lattice defect dipoles rather than free electron hopping. To achieve this, both donor and acceptor heteroatomic substitutions are introduced into the host materials substantially simultaneously. The former substitution creates delocalized electrons from the reduction of a nearby host transition metal atom while the latter substitution provides a local oxygen-deficient environment assisting the reduced host cations to hold back the delocalized electrons. The result is the formation of a defect-dipole complex/cluster consisting of the local combination of a partially delocalized electron, substitutional heteroatoms (both acceptor and donor) and reduced host cations. Most importantly, the overall defect-dipole complex/cluster is charge balanced. The most important consequence of the formation of such defect-dipoles, apart from the CP itself, is that low dielectric loss is expected because the produced electrons are locally bound by the oxygen-deficient environment and cannot undergo lattice hopping through the structure.

Thus, various metal oxides have "supercapacitor and colossal permittivity" performances. The present disclosure shows that supercapacitors may be formed because of "self-doped Aluminum oxide generated dipoles by positive charged oxygen vacancy and its electrons" that formed by oxygen deficiency-profile-thicknesses (See FIGS. 3a and b) and related formed dipoles (See FIG. 6b), Active capacitors may form when a vacancy concentration in a constant vacancy region reaches a critical concentration (See FIG. 2 and FIG. 3a) where vacancy hopping conduction takes place. A function of a two-layer interface ((FIG. 3a and FIGS. 5a and b), comprising $Al_2O_3$ "insulating" film and "vacancy-gradient-film" with gradually increasing vacancy. Vacancy hopping conduction may occur when oxygen vacancy levels reach a critical concentration in the "oxygen-vacancy constant" layer. Functions of the two-layer interface and vacancy constant layer shown in FIGS. 5a and b will be explained in the provided Examples section.

In the present disclosure, "charge neutrality" exists in the determined capacitances because each oxygen vacancy created by one missing oxygen provides two positive charges by leaving two electrons that confine in oxide. Vacancy and confined electrons may form dipoles, acting like an electric spring because the vacancy can respond to an electrical field but the confined electrons may not response to the electrical field (See FIGS. 6a, b, c). Vacancy may carry a positive charge because of each missing oxygen and their electrons confined in the oxide.

Figure 8:
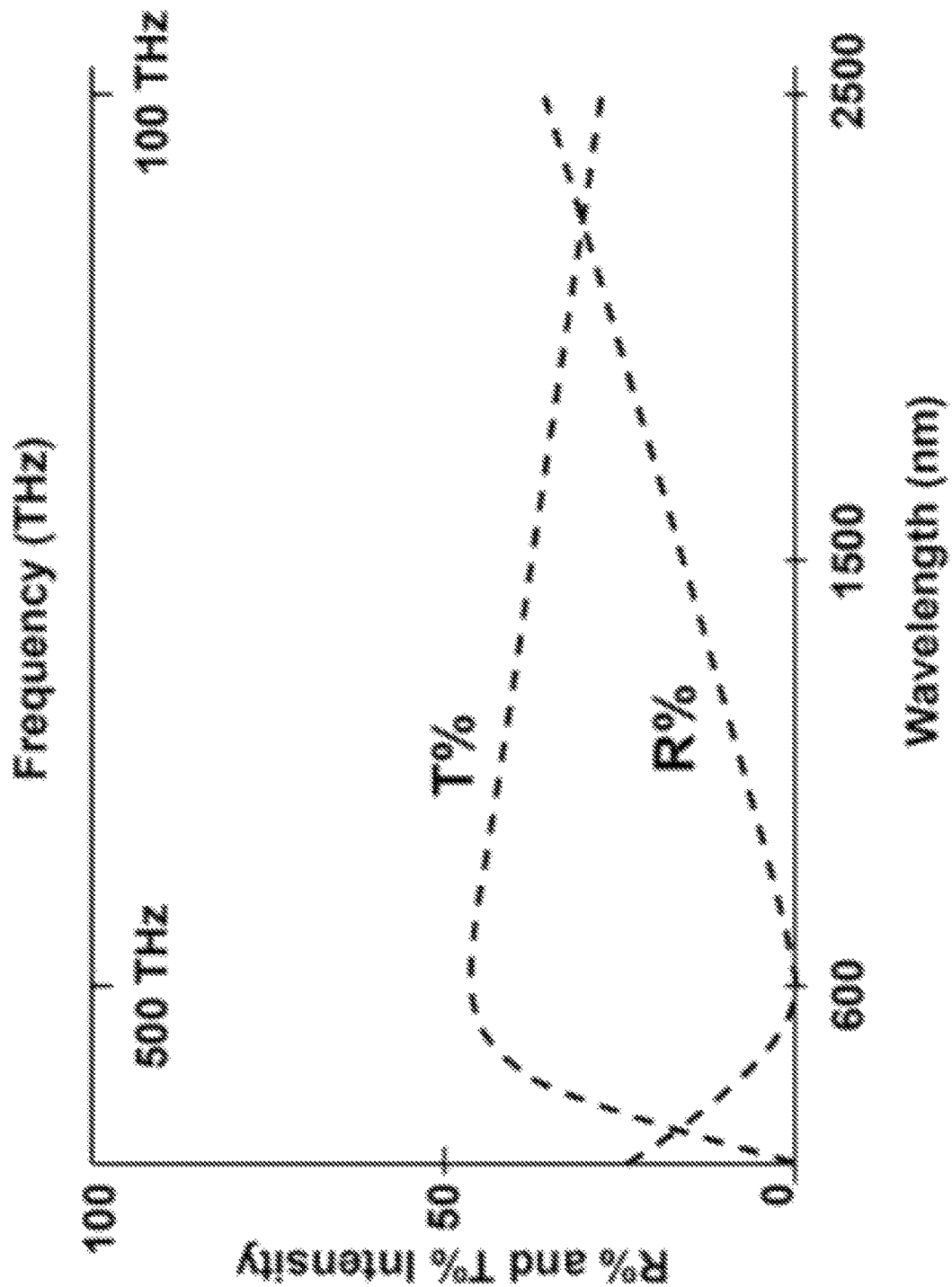
FIG. 8 shows a reflectance and transmittance plot of plasmonic coating.
Figure 9:
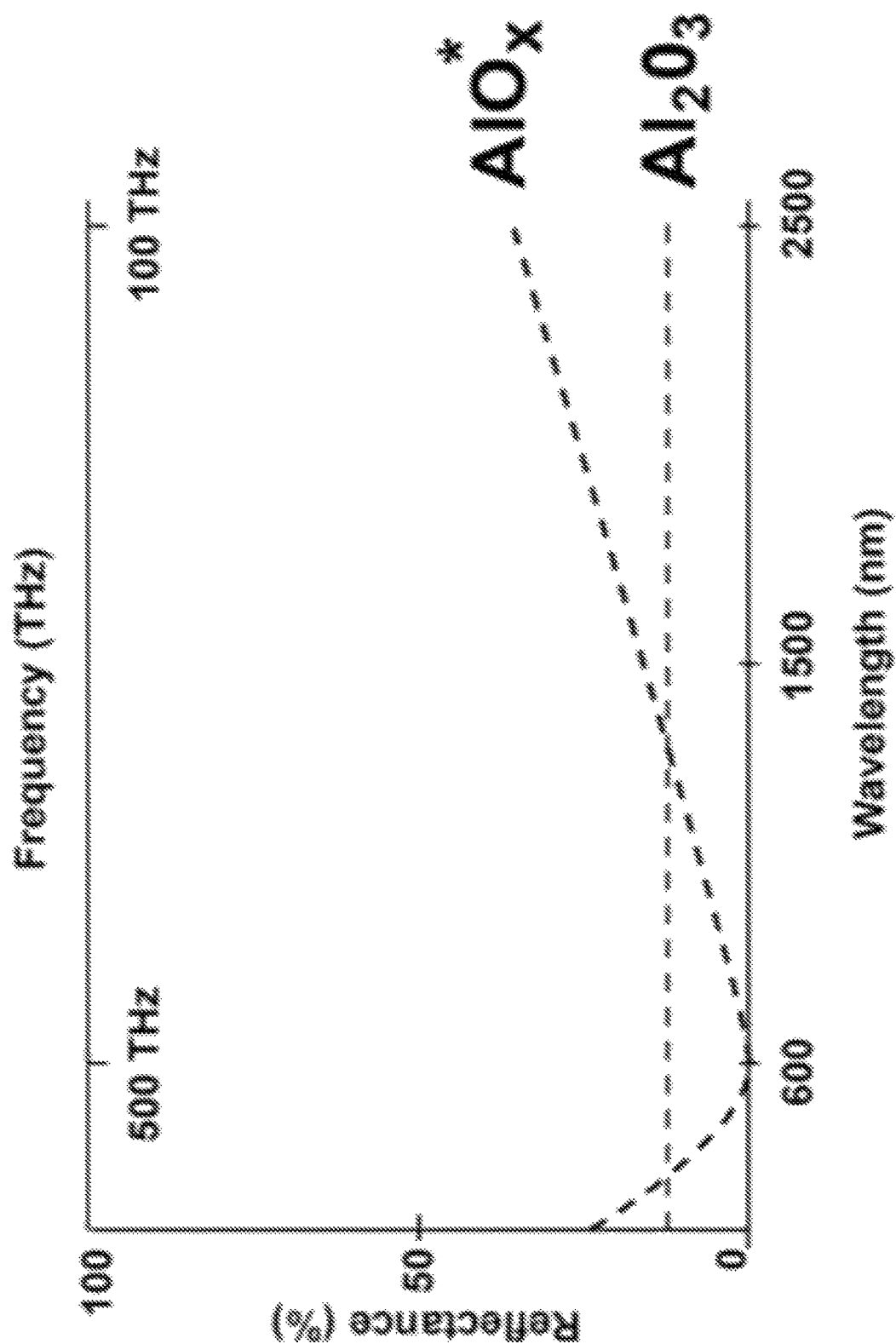
FIG. 9 shows a comparative spectral reflectance of deposited thin films.

Because measured resistivity of plasmonic oxide is still very high, $\rho \sim Exp\ 11$ Ohm/cm and breakdown field$>$Exp 6 V/cm. This means oxide is still a good insulator in plasmonic supercapacitor conditions and electron in the capacitor stays confided and not movable but only vacancies are movable. When evaluating capacitive performance of plasmonic capacitors, observations in the KHz region are made, and MHz region insulator to metal transitions of material as well on optical sample are observed similar to a transition in the THz region (FIGS. 8 and 9).

Frequency and bias voltage dependent transitions are due to resonance frequency of the metamaterials plasmonic oxide. In the present disclosure, Aluminum oxide is used to reach plasmonic oxide AlO*x. Instead of Al, other metal M may be used to form MOM capacitors (See FIG. 5) where oxides are NiOx, WOx, TiOx, CuOx, TaOx, CoOx and others as oxide and M metallic inclusions and electrodes are generally good conductors like Al, Au, Ag, Cu, and adhesion enhancing metal electrodes like Ni, Cr, additional layers. Oxide and metallic inclusions create a plasmonic medium in which resonance frequencies depend on optical parameters of both a host medium and a metallic inclusion.

In the present disclosure, $Al_2O_3$ and AlOx oxides may be used in vacuum deposited thin film parallel plate oxide capacitor, PPOC. Capacitors may be formed with stoichiometric $Al_2O_3$ and oxygen deficient AlOx films. (See FIGS. 2 and 3). During oxide deposition there is an extra glass substrate to evaluate optical performance of oxides. In a critical oxygen deficient oxide condition AlO*x plasmonic film and plasmonic parallel plate PPAlOx* capacitors are obtained. Plasmonic oxide capacitors are active capacitors responding to bias voltage and RF frequencies, exhibiting insulator to conductor resistive switches (See FIGS. 6a-c). Plasmonic capacitors are tunable switchable-voltage-controlled supercapacitors.

Aluminum Oxide Deposition Process

There are various deposition methods to make AlOx films by reactive evaporation of aluminum in O2 oxygen atmosphere.

Deposition of Capacitors.

An electron beam (e-Beam) deposition process may be used to deposit both oxides and electrodes of capacitors. Optical and high field DC and AC electrical properties of resulting films are compared depending on oxidation profile, thickness, and capacitor area.

E-beam deposition is a type of thermal evaporation of material in vacuum environment. When a vacuum level reaches a desired low pressure, generally Exp−6 Torr, material located in a crucible is heated by an e-Beam source focused to the crucible. When the temperature of the heated source reaches evaporation temperature, material evaporates from the heated point source and is spherically distributed into a vacuum chamber and the substrate is coated with evaporated source material. In reactive e-beam deposition, reactive gas is inserted into a vacuum environment. Reactive gas, for example oxygen or nitrogen, helps to form oxide or nitride of evaporated metal. In the present disclosure ionized oxygen is injected into the chamber, in the vicinity of substrate to facilitate formation of oxide films at the substrate surface.

Electrodes were deposited at, for example, 1.6Exp−6 Torr background chamber pressure with 0.1-0.5 nm/s deposition rate. (See FIG. 1). One extra test substrate was used, BK7 glass, for optical evaluation of resulting oxide, and special larger area mask to form oxide of capacitors to prevent shorting of electrodes.

Figure 2:
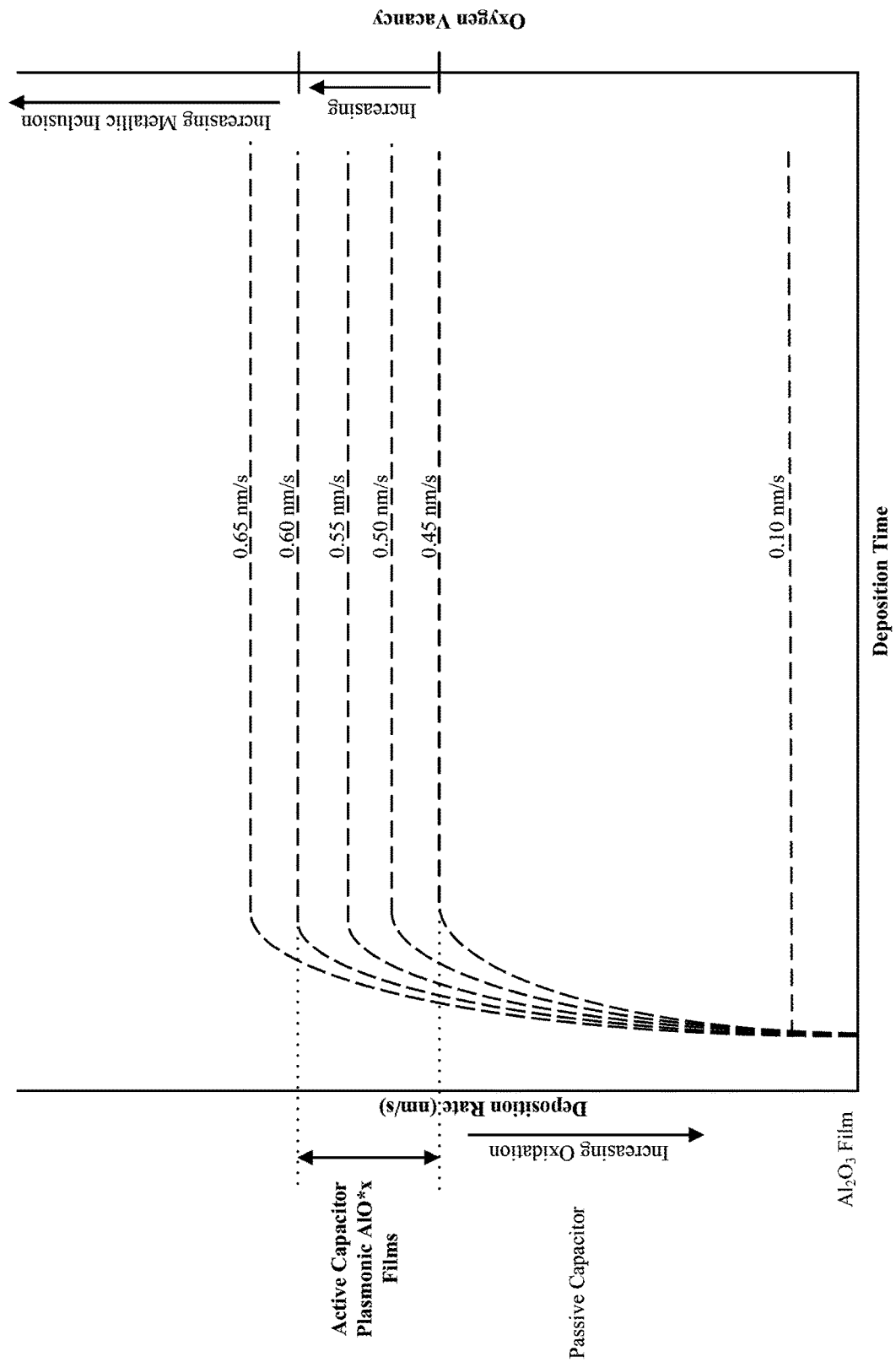
FIG. 2 shows performance of oxide films at varying deposition rates.

$Al_2O_3$ and gradient oxide layer and AlOx constant oxygen vacancy regions are formed in, for example, one pump down deposition cycle. Metal oxides were formed by e-beam-heated metal source of Aluminum in the presence of an oxygen plasma. Deposition rate vs. time plot is shown in FIG. 2. The deposition rate may be controlled by heating power of crucible and the resulting oxide thickness may be controlled by deposition time. When a vacuum level reaches 1.6Exp-6 Torr. The chamber filled with reactive oxygen plasma until pressure reaches 2× Exp-5 Torr and oxide deposition starts by controlling deposition rate (See FIG. 2). Deposition time controls the film thickness and deposition power controls the oxidation level of oxide. Resulting oxide film having Al$_2$O$_3$+ gradient oxide interface film and constant oxidation layer shown in FIG. 3. The top electrode mask provides multiple capacitor areas to facilitate area dependent evaluation of capacitors (See FIGS. 11 a-d).

FIGS. 1-6 show deposition flow chart, materials, and resulting coatings and some brief related information.

FIG. 1. The bottom electrode/Oxide/Top electrode deposition sequence, deposition flow chart and material. Thickness and deposition rates are also shown in FIG. 1.

FIG. 2 shows a deposition rate vs. deposition time plot of oxides and a resulting performance of oxide films. Plasmonic active capacitors, passive capacitors, including stoichiometric Al$_2$O$_3$ film formation region is shown in the figure. An oxygen vacancy concentration of AlOx* plasmonic oxide film region, corresponding to deposition of 0.45 nm/s to 0.6 nm/s is shown in the figure. Where oxygen vacancy concentration may be calculated from capacitance measurement by comparison of permittivity of Al$_2$O$_3$, AlOx, and AlOx* films by using effective medium approximation. The trend of increasing vacancy being related to deposition rate is shown in FIG. 2.

FIG. 2 shows deposition rate vs. deposition time graphs of oxides including stoichiometric Al$_2$O$_3$ and plasmonic oxide formation conditions and corresponding oxygen vacancy concentration calculated from dielectric permittivity (dielectric constant) comparison of AlO*x to Al$_2$O$_3$. FIG. 2 shows AlO*x plasmonic oxide region where one can deposit metamaterial plasmonic aluminum oxide AlO*x.

Figure 3A:
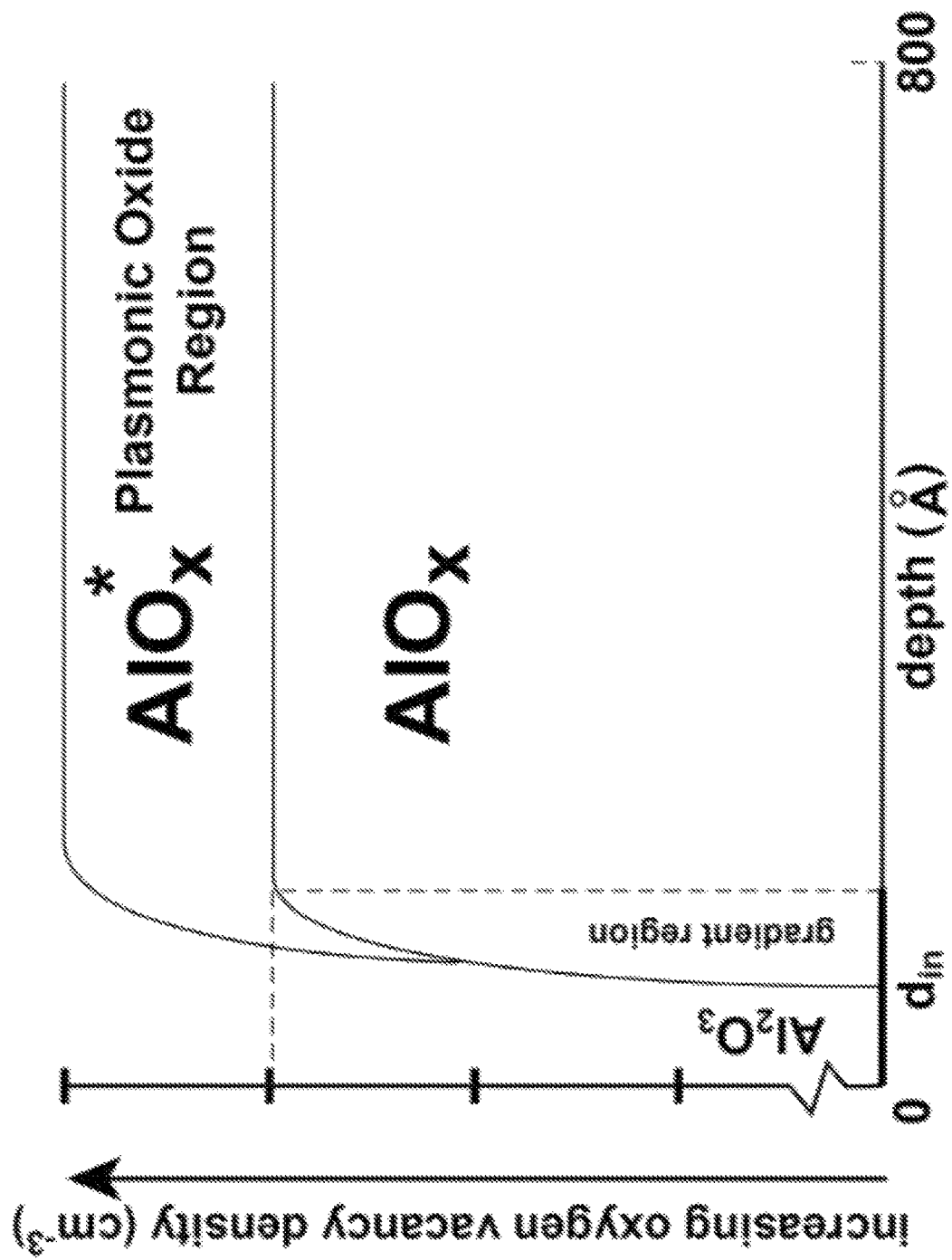
FIG. 3A shows a cross-section of an example film described in FIG. 2.

FIG. 3A shows a cross section of resulting films given in FIG. 2. Where an interface comprising "Al$_2$O$_3$" and oxidation level x is gradually decreasing, but oxygen deficiency is increasing, a "gradient region" forms. Following the gradient region, a "constant oxidation region" of "AlOx" forms during the rest of increasing deposition time. Capacitors comprising Al$_2$O$_3$ and AlOx oxides are passive capacitors. Passive capacitors are not changed with DC bias voltage and RF frequency. Optical appearance of oxide films from Al$_2$O$_3$ to AlOx change from clear to gray to darker gray with decreasing x. Capacitive performance is similarly changed from low loss factor Tan $\delta=\epsilon''/\epsilon'$, (<0.001 to high and $\epsilon''$ low imaginary part of complex permittivity and high quality factor, Q=1/Tan $\delta$ to low with increasing $\epsilon''$. Plasmonic AlO*x region is shown in the FIG. 3A. Functions of insulation film of Al$_2$O$_3$, gradient oxide film, and constant oxygen vacancy film AlOx will be given in Examples.

Figure 3B:
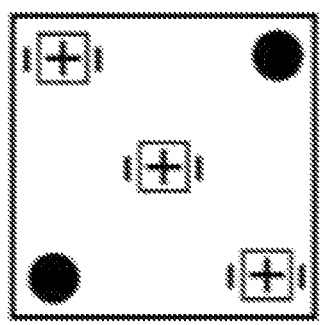
FIG. 3B shows example unit cells of aluminum oxide.
Figure 3B:
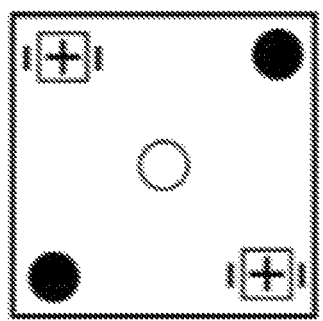
Figure 3B:
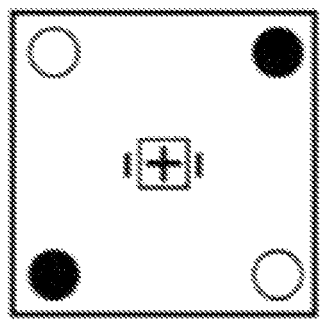
Figure 3B:
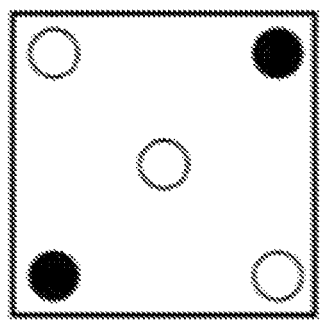

FIG. 3B schematically shows unit cells of a stoichiometric Aluminum oxide (unit cell at left). Unit cell having one lost oxygen by creating one oxygen vacancy {[2+]+2e(--)} shown $2^{nd}$ left cell. Unit cell lost all oxygens forms metallic Al film (last unit cell).

Stoichiometric oxide 2Al(+3). 3O(-2).

Unit cell with one missing oxygen condition 2Al(+3)·2O (-2)+{[2+]+2e(--)}. Where [2+] represents one oxygen vacancy carrying 2+ charges and one oxygen vacancy creates two electrons 2e(--). These released two electrons per missing Oxygen confine in the oxide. Charge neutrality must exist in the coating.

Capacitance of a capacitor between two electrodes filled with air (air capacitor) and filled with oxide, having A area and d thickness and permittivity $\epsilon_o$ and $\epsilon$ is given by Equations 1 and 2.

$$C_o=\epsilon_o A/d \text{ air capacitor} \tag{Eq. 1}$$

$$C=\epsilon\epsilon_o A/d=\epsilon C_o \text{ Dielectric capacitor} \tag{Eq. 2}$$

Where permittivity of free space:

$$\epsilon_o=8.85 \text{ exp-12 F/m} \tag{Eq.3}$$

And complex permittivity of an oxide film for frequency f is given by:

$$\epsilon(f)=\epsilon'(f)-i\epsilon''(f) \tag{Eq.4}$$

Where $\epsilon'$ and $\epsilon''$ are the real and imaginary components of complex primitivity. Real part $\epsilon'(f)$ shows polarization capability of the medium at frequency f and $\epsilon''(f)$ represents the total lost in the oxide at that frequency f.

Lost factor tan $\delta$ is a measure of phase angle in a complex presentation of permittivity as a ratio of the imaginary part to the real part of complex permittivity and given by:

$$\tan \delta=\epsilon''/\epsilon' \tag{Eq.5}$$

And Quality factor Q by:

$$Q=1/\tan \delta=\epsilon'/\epsilon'' \tag{Eq.6}$$

A good dielectric medium has a high Q quality factor and low loss factor. In a DC circuit $\Delta V/\Delta I$ slope of Current-Voltage characteristics give resistance R=V/I. of the circuit.

In an AC circuit case capacitive reactance Xc is given by:

$$Xc=1/\omega C \tag{Eq.7}$$

Where angular frequency $\omega=2\pi f$ and f frequency and C capacitance of the circuit. As seen from FIG. 3A, the capacitor comprises three oxidation regions and corresponding three permittivity's, thus the effective-medium application is very complex. In this calculation one can use an effective medium approximation. So, calculated permittivity corresponds to the combination of interface films and AlOx bulk film. Since oxidation level x effects both $\epsilon'$ and $\epsilon''$ vacancy density is not calculated but the trends how vacancy density is related with deposition rate in FIGS. 2 and 3 is shown. FIG. 3A shows a cross section of oxide films in the PPO capacitors. FIG. 3B shows depth profile of oxides in an active capacitor. Bottom electrode-oxide interface comprises a 5-10 nm thick Al$_2$O$_3$ film+a 7-10 nm thick oxygen vacancy gradient film, (two-layer interface film), and a constant oxygen deficient oxygen in the oxide.

FIG. 3A shows a cross section of oxide films in the PPO capacitors. FIG. 3B shows a depth profile of oxides in an active capacitor. Bottom electrode-oxide interface comprises a 5-10 nm thick Al$_2$O$_3$ film+a 7-10 nm thick oxygen vacancy gradient film, (two-layer interface film), and a constant oxygen deficient oxygen confides in the oxide.

Figure 4:
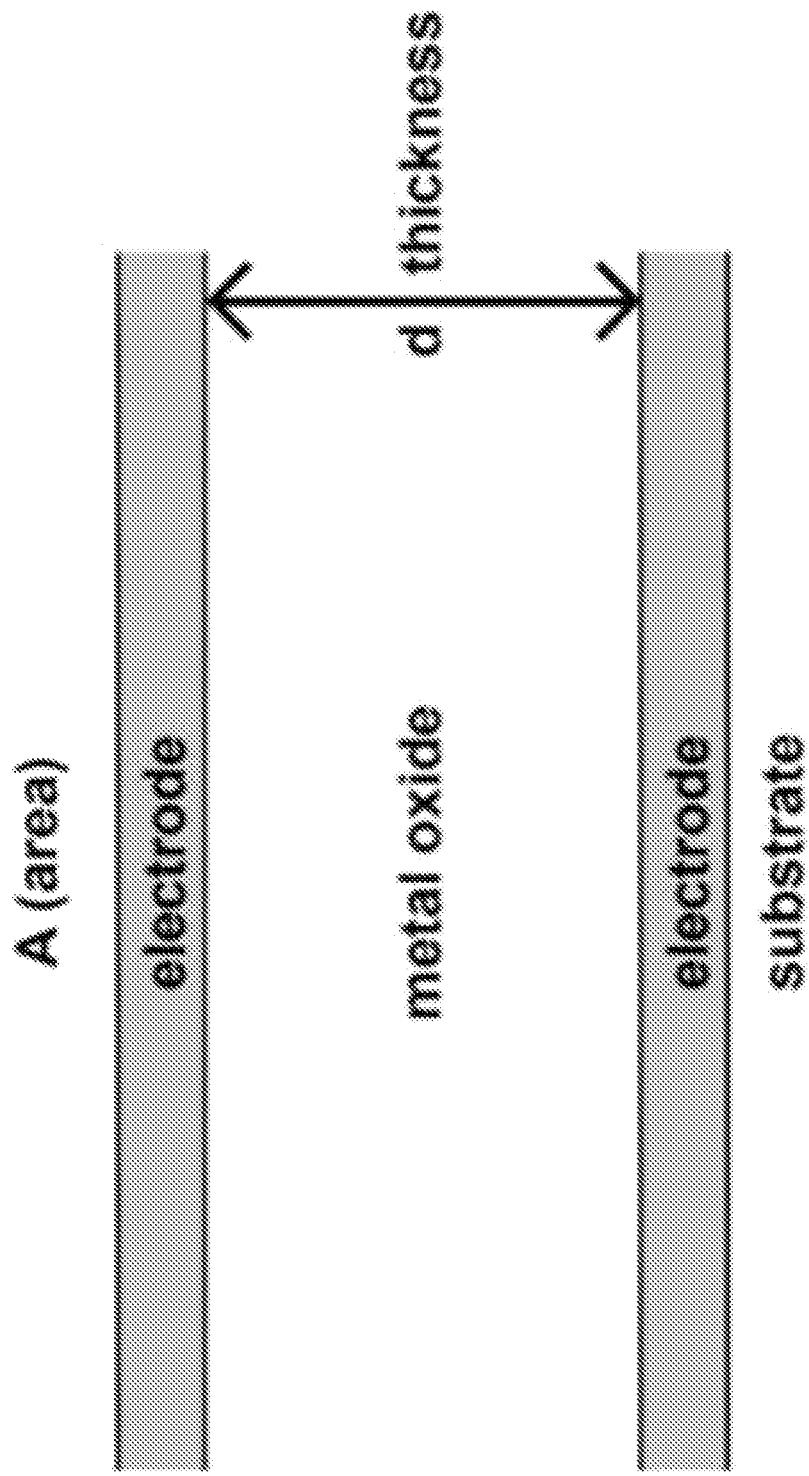
FIG. 4 shows an example capacitor.

FIGS. 4 and 5 show a parallel plate oxide capacitor, PPOC, and PPOxC capacitors in general Metal-Oxide-Metal capacitor form. Where various metal electrodes and oxides can be used to make symmetric or asymmetric-electrode capacitors, for example, (N.B., electrode Al, Au, Cu, and adhesion enhancing metal electrodes like Ni, Cr, additional layers. And oxide materials NiOx, WOx, TiOx, CuOx, TaOx, CoOx).

FIG. 4 shows a Metal/Oxide/Metal capacitor having capacitive area A and thickness d. The oxide material has a relative permittivity $\epsilon$ increase air capacitor capacitance $\epsilon$ 8.85 Exp-12 F/m. Where $\epsilon_o$ is free space permittivity, $\epsilon_o$=8.85 Exp-12 F/m, and capacitance C=$\epsilon C_o$.

Figure 5A:
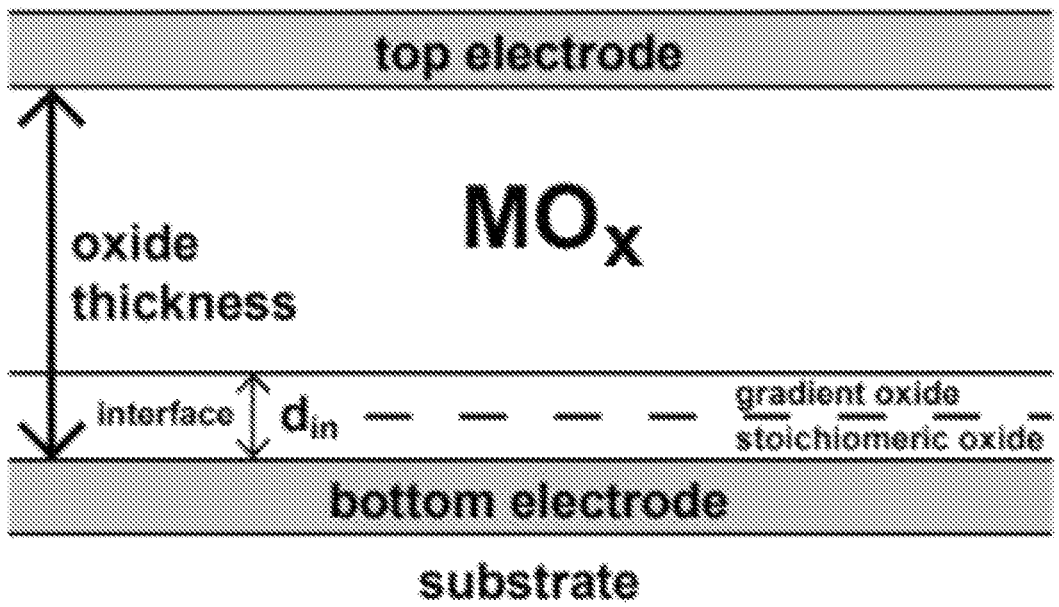
FIG. 5A shows a cross-section of an example capacitor.
Figure 5B:
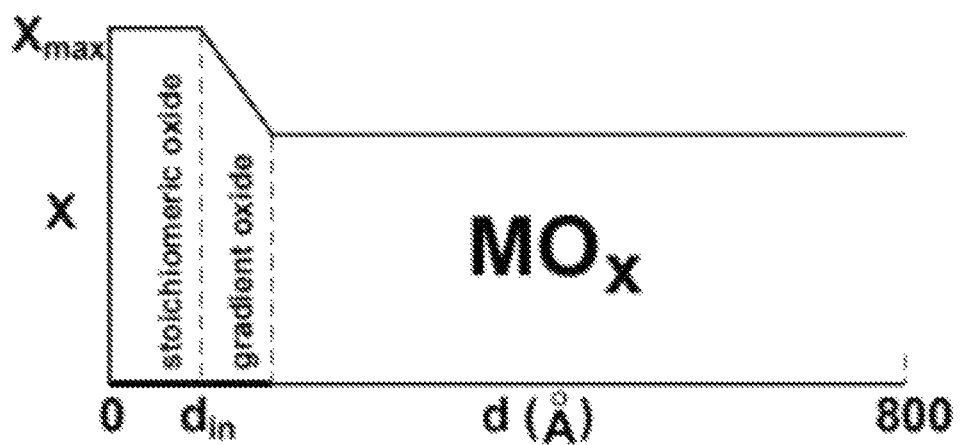
FIG. 5B shows an example thickness of portions of a film.

FIG. 5A shows a cross section of an active capacitor (a) and depth profile of oxide in the capacitor. (b) In FIG. 5B. Xmax presents stoichiometric oxide such as $Al_2O_3$, and Xmax decreases to x in the gradient x region. Then constant x region continues to reach desired total film thickness.

Figure 6B:
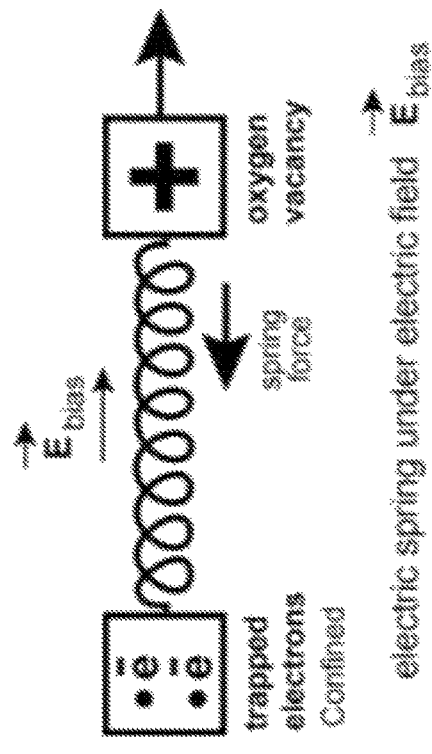
FIG. 6B shows an example capacitor.
Figure 6C:
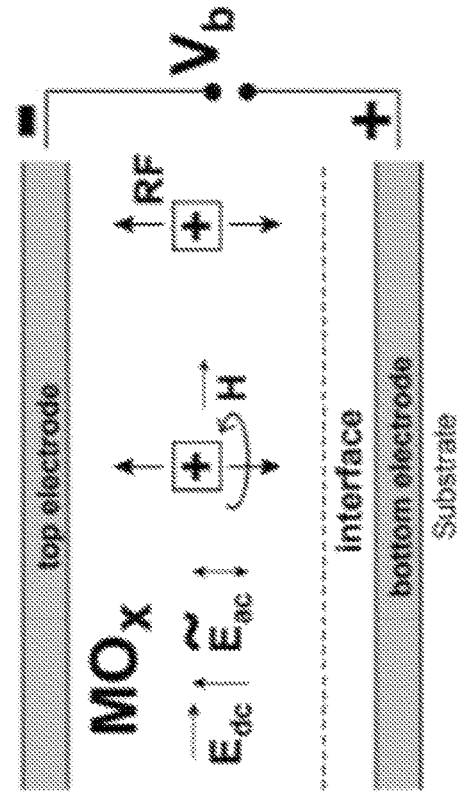
FIG. 6C shows an example capacitor.
Figure 6A:
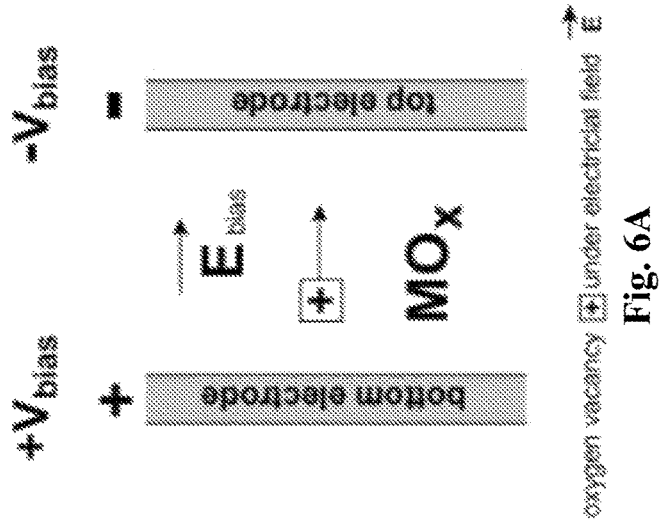
FIG. 6A shows an example capacitor.

FIG. 6 shows a positively charged vacancy under applied E (bias electrical field). FIG. 6A shows [+] charged oxygen vacancy under electric field. Since there is a moving charge around it a magnetic field (H) is created.

Movable Oxygen vacancy (++) and confined electrons (−−) form dipoles in the oxide. Since electrons cannot move in a dielectric medium, the electrons stay in their created position but positively charged vacancy center can move with applied E→ field direction under bias electrical field. So, dipoles act like electrical spring, for example, as shown in FIG. 6B.

FIG. 6C shows positively charged vacancies [+] under electrical fields created by both DC and AC→electrical fields. Where an AC magnetic field is created by moving charge with same frequency AC source. Movable vacancy charges under DC and AC electrical field. Moving charges creates an alternating magnetic field H around charges, for example as shown in FIG. 6C. This means the described capacitor may be effected by magnetic field as well as electrical field.

Characterization of $Al_2O_3$ Coatings
Optics and Capacitive Performance of $Al_2O_3$ Films Oxygen vacancies comprising oxides were vacuum deposited by PVD of e-beam or reactive thermal evaporation or sputtering of metal in vicinity of ionized oxygen atmosphere. In this experiment metallic Aluminum target was used, and Al, AlOx and $Al_2O_3$ films were formed by controlling vacuum conditions. A faster deposition rate of Al in same vacuum conditions forms oxygen deficient AlOx films having oxygen vacancies and Al nanoparticles. FIG. 2, for example, shows deposition conditions of $Al_2O_3$ stoichiometric oxide and AlOx oxygen deficient oxide formation regions. Oxide films deposited from 0.1/s up to 0.45 nm/s are optically very clear, non-absorbing. at a slow deposition rate and become slightly gray colored oxide with increasing deposition rate. The capacitors of such oxides are passive capacitors and may not show any changes in their capacitive performance on bias voltage.

Figure 7A:
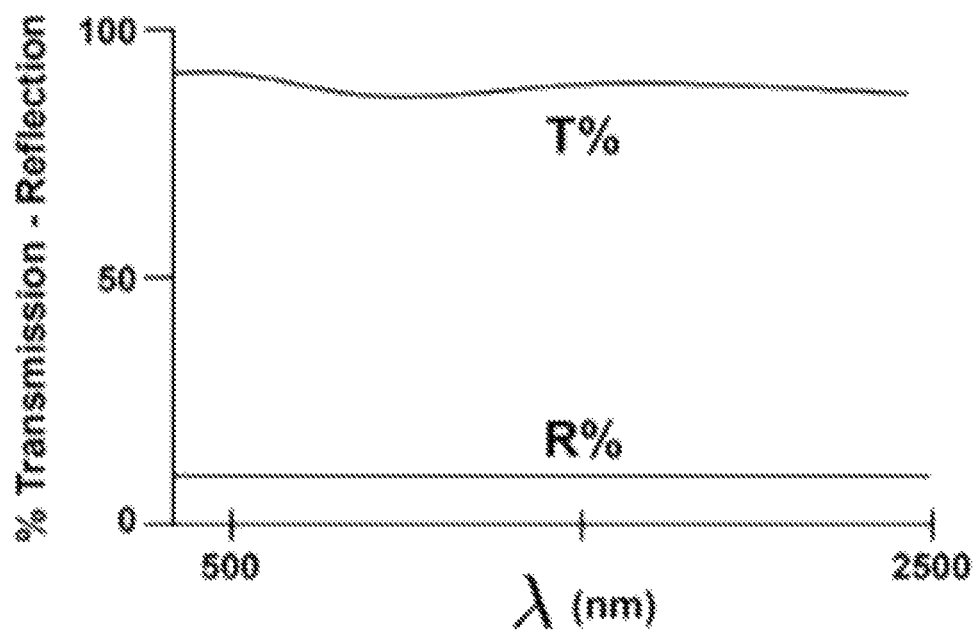
FIG. 7A shows a spectral transmittance and reflectance of a deposited film.
Figure 7B:
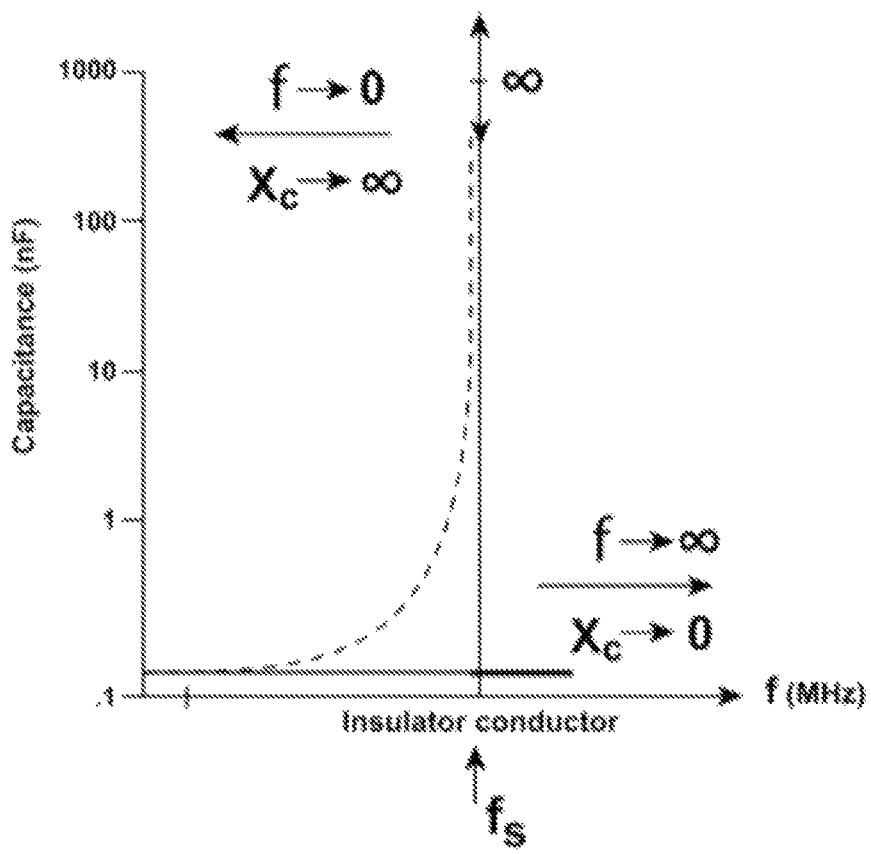
FIG. 7B shows a capacitance varying based on frequency.

Passive capacitors, for example a capacitor with $Al_2O_3$ oxide, does not show any voltage and frequency dependency and stays 0.1 nF at up to ~80 MHz (See FIG. 7B). At higher frequencies, the oxide become conductive as explained in FIG. 7C.

FIG. 7A shows spectral transmittance and reflectance of a thick near stoichiometric $Al_2O_3$ films deposited on glass substrate.

AlOx films exhibit more optical absorption with deeper gray color with decreasing oxidation level. Oxide films between two metal electrodes form parallel plate oxide capacitors, PPOC. The capacitors using clear $Al_2O_3$ films indicated by PPOC and capacitors with oxygen deficient gray colored AlOx films by PPOxC.

All capacitors were evaluated in room temperature, under uniform electric field created by D.C. bias voltage applied to the electrode of capacitor and RF field created by radio frequency source. A Vector Network Analyzer was used to measure capacitive performance of capacitance spectra of the capacitors. FIG. 7A shows a capacitance spectrum of an $Al_2O_3$ film between metal electrodes of 80 nm thick and A mm2 surface area PPOC capacitor evaluated in a frequency region of hundreds KHz to hundreds MHz. A relative dielectric permittivity value of 9 was calculated for e-beam deposited $Al_2O_3$ films for low frequency flat capacitance region.

Capacitive behavior, C vs. f frequency, plot of $Al_2O_3$ thin film PPOC shows a usual passive capacitor performance of a capacitor being a flat, frequency independent region followed by a sharp increasing positive capacitance region where capacitive reactance Xc decreases with increasing frequency. $Al_2O_3$ dielectric capacitors do not show bias voltage dependence; they are passive capacitors.

FIG. 7B shows a schematic Capacitance C and capacitive reactance Xc (=½πfC) spectrum of PPOC formed by using $Al_2O_3$ film. This is same common spectrum of a dielectric PP oxide capacitor. Essentially, capacitance stays constant from low to medium frequencies and corresponding capacitive reactance, Xc(f)=1/(2πfC), decreases with increasing frequency f→infinity and Xc→zero. At higher frequencies, capacitance starts to increase and Xc(f) goes to zero as frequencies increase. This flat capacitive region is followed by positive slope capacitance region where capacitance increases, and reactance decreases with increasing frequencies and goes to zero.

Capacitive behavior of a capacitor in a variable frequencies condition as being a sort of frequency-controlled resistor. As Capacitive reactance goes to infinity at very low frequencies (open circuit condition) and goes to zero at very high frequencies (short circuit condition).

Figure 7C:
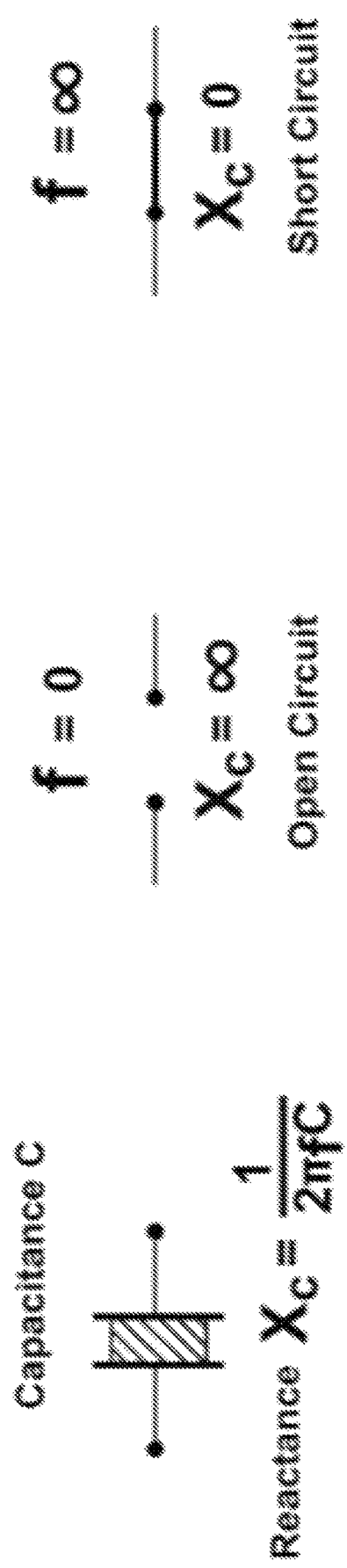
FIG. 7C shows an example reactance-frequency dependence based on varying circuit conditions of a capacitor.

Reactance-frequency dependence and corresponding circuit condition of a capacitor are shown schematically in FIG. 7C.

Dielectric material in a capacitor is an insulator. Direct current, DC bias voltage case current I=0; no current passes through in the capacitor, but in an alternative voltage case and at high frequencies capacitive reactance Xc=½πf C of dielectric material goes to zero, and dielectric material become conductive and I=Imax current pass though. FIG. 3B schematically shows frequency-reactance relations. So at high frequencies the capacitor becomes electrically short.

FIGS. 7A, 7B, and 7C give $Al_2O_3$ related optical (FIG. 7A) and a capacitive (FIGS. 7B and 7C) results.

FIGS. 7A, 7B, and 7C show spectral performance of $Al_2O_3$ film deposited on glass (FIG. 7A) and capacitive performance of a PPOC with $Al_2O_3$ film (FIG. 7B) and Xc reactance of oxide capacitor before and after switching from insulator to conductor. Switching frequency fs shown in the FIG. 7B and corresponding reactance in FIG. 7C.

From optical characterization of $Al_2O_3$, a refractive index n of the coating was calculated from reflectance as $R=\sqrt{[(n-1)/(n+1)]}$~1.59. This refractive index value is well fitting the references.

From a flat frequency region of capacitance spectrum shown in FIG. 7B a dielectric permittivity may be calculated using geometrical values of the capacitor: A=0.16 mm2 and d=80 nm in thickness and C=0.18 nF. The measured capacitance values of the capacitor being ε=9. This result is well fitting to the previously described values.

FIG. 7A shows Spectral Reflection (R %) and transmission (T %) plots of a ~200 nm thick $Al_2O_3$ film deposited on glass substrate.

Plasmonic Oxides and Plasmonic Capacitor.

In FIG. 2 the deposition rate of e-beam oxide films and resulting passive and active coatings is summarized. In this section, the active "plasmonic" films' optical performance, (See FIGS. 8 and 9), and the capacitive performance in FIGS. 10A and 10B are given.

Optical observation of the plasmonic AlO*x coatings are shown in FIG. 8 and FIG. 9. The capacitive performance of a PP plasmonic capacitor is shown in FIG. 10A and FIG. 10B.

FIG. 8 shows spectral reflectance and transmittance plots of 80 nm thick metamaterial plasmonic AlO*x coating deposited on glass substrate.

Figure 10A:
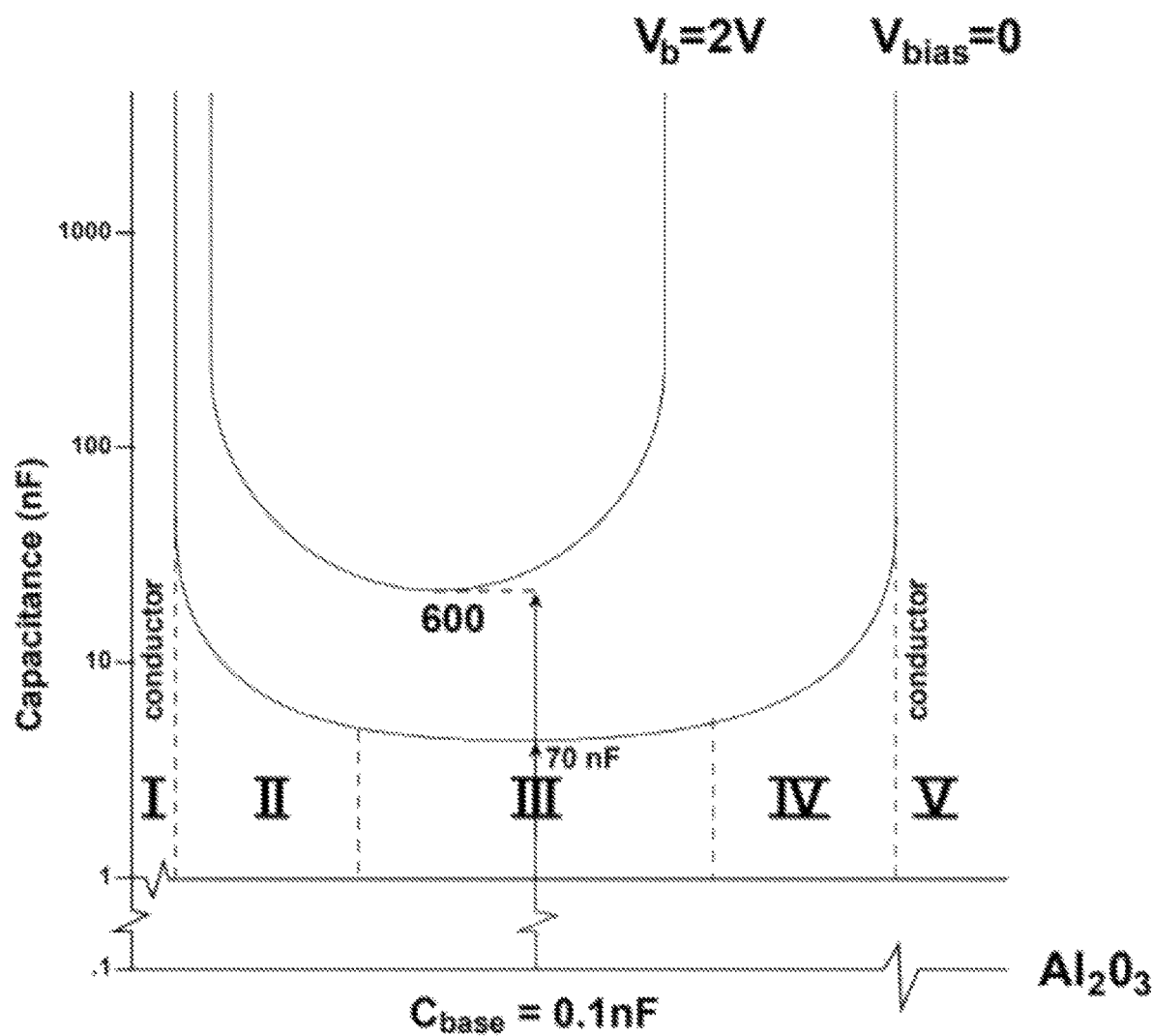
FIG. 10A shows capacitive performance of example capacitors.
Figure 10B:
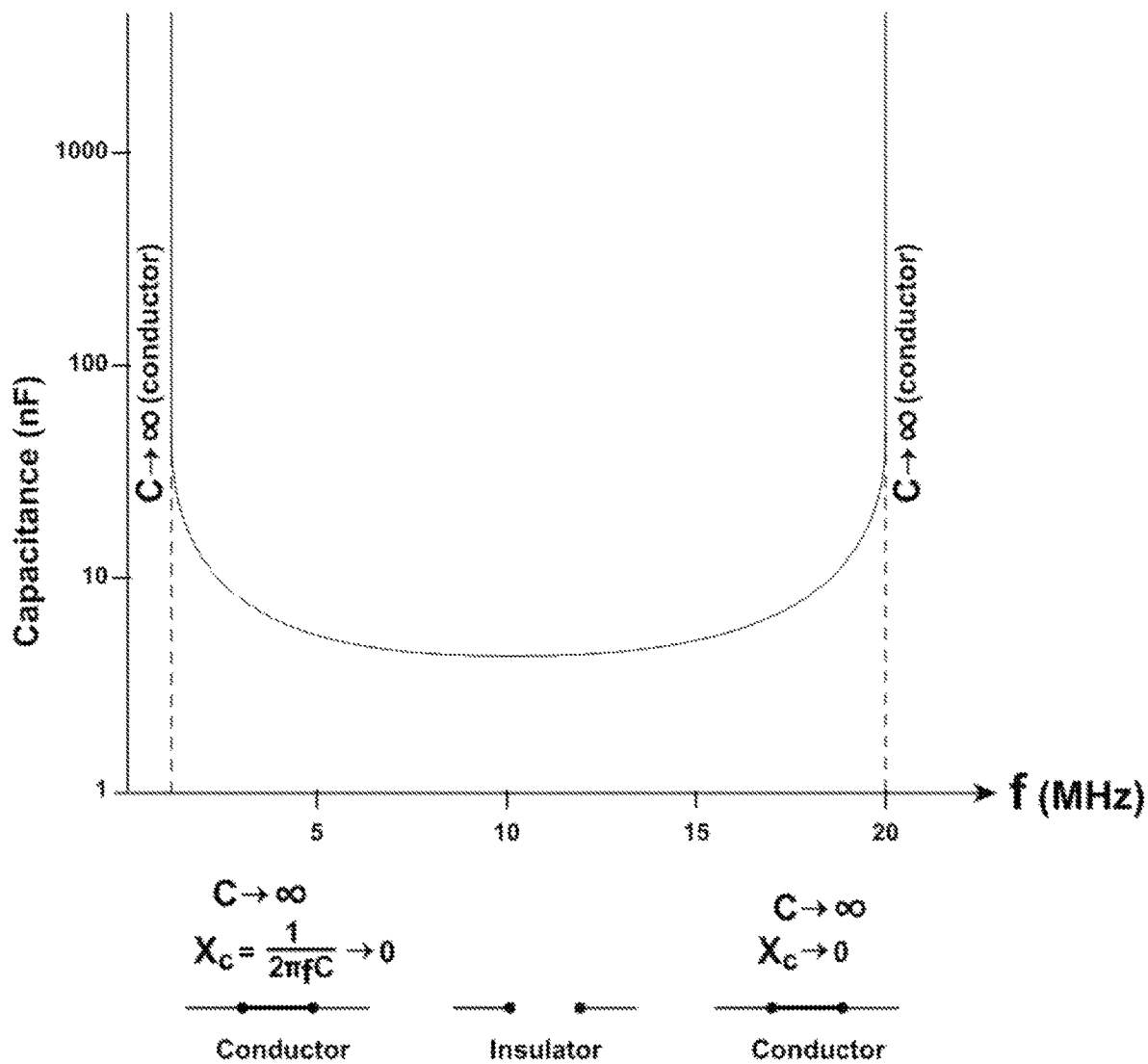
FIG. 10B shows an example on varying circuit conditions of a capacitor.

FIGS. 8, 9, and 10A and B show spectral performance of plasmonic AlO*x film deposited on glass (FIG. 8), cloaking ENZ performance and references (FIG. 9) and capacitance spectra and circuit condition of a plasmonic capacitor (FIGS. 10A and B).

A faster deposition rate of Al in the same vacuum conditions forms oxygen deficient AlO*x films having oxygen vacancies and may be even metallic Al nanoparticles form in it. FIG. 3B shows unit cell transitions from $Al_2O_3$ to AlOx by losing oxygen. AlO*x films optically are still transparent having light to darker gray tinted films. Spectral transmittance and reflectance such deeper gray film are shown in FIG. 8. FIG. 9 is a comparative reflectance spectra presentation of Stoichiometric $Al_2O_3$ films given in FIG. 7A having ~90% transmission and ~10% reflectance, are very different that of AlO*x films shown in FIG. 8 and FIG. 9. $Al_2O_3$ films are very transparent and exhibit flat T and R % spectra but AlO*x film are highly absorbing exhibiting a 48% maximum transmission and near zero reflectance at ~550 nm. This near zero reflectance and near zero refractive index, indicates this composition and structure of AlO*x film is a metamaterial called epsilon near zero (ENZ) material. ENZ materials are known as plasmonics that are metal nanoparticle comprising dielectric composites. In the present case, oxygen vacancy may have very low levels of metallic nanoparticles comprising AlO*x film show ENZ performance. In other words, material at around 600 nm (500 THz) exhibits zero resistance switches from dielectric to conductor. Such a wavelength selective absorbing metamaterial surface of an AlO*x forms a metasurface in which selective resonance absorption is in the visible spectrum. A Unit cell of such composite structure is shown in FIG. 3. In between $Al_2O_3$ stoichiometric oxide and Al metal rich oxide, there is oxygen vacancy plus metallic nanoparticles comprising Metamaterial Plasmonic-AlO*x. where reflection zero at ENZ condition, where $\varepsilon''=0$.

FIGS. 8 and 9 give spectral performances of plasmonic AlO*x film in nm wavelength scale and in THz region frequency scale. Conversion of λ (m) to f(Hz) shows electromagnetic wave propagation speed c(m/s)=3Exp 8=f(Hz)λ(m).

FIG. 8 shows R (%) and T (%) intensities in λ (nm) and f (Hz) scales. Reflectance reaches near zero around 600 nm R=0.2%, corresponding 500 THz indicated on the FIG. 8 in THz scale and wavelength scale, nm. Table I. shows visible (Vis) and near infrared (NIR) conversion.

This conversion can be calculated as electromagnetic wave velocity in vacuum c(m/s)=3 Exp 8.

Reflectance spectrum of Plasmonic-AlO*x film exhibits a near zero reflectance in the center of visible region. As shown, yellow light is at 550-600 nm and is absorbed by the coating but the rest of the spectrum is reflected from the metamaterial surface, also referred to as a metasurface. Materials with near zero effective permittivity of a composite material that would create band gaps in a wide range of frequencies up to the visible. The physical realization of these materials is that the existence of metallic nanoparticles, nanowires create negative effective permittivity conditions.

Plasmonics are ENZ materials specifically heavily doped semiconductors, while transparent conductors are sandwiched composites.

FIG. 9 shows comparative spectral reflectance of $Al_2O_3$ vs AlO*x films deposited on glass.

FIG. 10A shows capacitive performance comparison of a passive $Al_2O_3$(FIG. 7B) and AlO*x plasmonic active capacitor. FIG. 10A shows Capacitance spectra of plasmonic capacitors for $V_{bias}=0$ and 2 V. FIG. 10B shows circuit conditions of capacitor at insulator to conductor transition frequencies.

A PP capacitor with AlO*x oxide exhibits mainly five C-f regions; a negative capacitance region where capacitance decreases with increasing frequencies, a flat capacitance region where capacitance is independent with frequencies, and a positive capacitance region, where capacitance increases with increasing frequencies. Both the low frequency edge of negative capacitance region and the high frequency edge of the positive capacitance region show capacitance goes to infinity so insulator to resistor switching occurs. A negative capacitance region of an AlO*x capacitor is created as deposited dipoles, formed by positively charged vacancies and confined electrons. More closely graded interface-charge profile of oxide at bottom electrode. The thicker the gradient region the wider the negative capacitance region by shifting to higher frequencies. Besides frequency dependence, AlO*x capacitor exhibits bias voltage dependence when oxygen deficiency x reaches to x* where AlOx* become plasmonic and having ENZ and negative refractive index performance. Both frequency and voltage dependency of AlOx* capacitor indicates that there are DC and RF electric field assisted movable charges exists.

The described plasmonic AlOx*capacitor is a supercapacitor. As the deposited capacitor in a zero bias condition is a charged capacitor.

Zero bias as deposited Capacitance of AlOx* capacitor increases 70 times by comparing 0.1 nF base capacitance of $Al_2O_3$. Zero bias Capacitance of 1.28 mm3 volume of AlO*x capacitor has 5.4 mF. Physical performance of AlOx* capacitors changes with frequency indicating that material interact with electromagnetic waves created by RF source as well as the DC electric field created by bias voltages. In the flat region capacitance of AlOx* capacitor material is a dielectric, holding 70× more charge than $Al_2O_3$. When a bias voltage is applied to this plasmonic capacitor, the top electrode having negative polarity, flat region and whole capacitance spectra moves to higher capacitances, indicating supercapacitor is a voltage controlled variable capacitor; it is therefore a varactor.

In both low and high frequency regions the capacitance goes to infinity and capacitive reactance goes to zero so the insulator material in the capacitor becomes a conductor. FIGS. 10A and 10B show frequency and bias voltage dependent physical performance of plasmonic AlOx* film in the capacitor. Between conductive and insulator states of AlOx* film there are two semiconductor phases where material is a tunable supercapacitor. In a negative capacitance-semiconductor region, the AlOx* is a tunable supercapacitor, (TSC) where capacitance increase with decreasing frequency. When f=fsw resonance frequency applied to capacitor vibrating internal charges under influence of applied switching frequency fsw the material absorbs that frequency and switches to a conductive phase. In the negative capacitance region, polarization of internal charges increases with decreasing frequency, indicating that capacitive lost is compensated with internal polarization. In the positive capacitance region, polarization of internal charges increases with increasing frequency where the capacitor has a high capacitive reactance.

FIG. 10B shows both ends of the negative capacitance and positive capacitance regions where capacitances go to infinity, which may occur at particular switching frequencies of AlOx* plasmonic capacitor switches, switching the capacitor from an insulating mode to a resistive mode. These fsw switching frequencies can be shifted by a bias voltage. A bias voltage may make shifts fsw to increasing frequencies in a negative capacitance region, while decreasing fsw in positive capacitance region. These changes indicate both bias related DC electrical field and RF related AC field and charge movement induced magnetic fields effects permittivity of medium. Reversal polarity puts the capacitor to original conditions.

The active capacitor is a thin film deposited solid state supercapacitor:

Oxygen deficient films have oxygen vacancies. Missing oxygen in an oxide form positively charged vacancy and two electrons of missing oxygen confined in the oxide. Vacancies and confined electrons form dipoles. The dipoles form during oxide deposition. Missing oxygen forms a positively charged oxygen vacancy by leaving their electrons in the oxide. Electron confines in the oxide. AlOx with confined electrons but with electric field direction movable oxygen vacancies is still a good insulator. PPOx* capacitor has as-deposited dipoles in its volume. It is a varactor (voltage controlled variable capacitor). Dipole moments of charges changes with electric field bias of voltage. It is a voltage-controlled supercapacitor due to the as deposited bulk dipoles. Supercapacitor (e.g., FIG. 10A comparing with that of PPC with $Al_2O_3$ in FIG. 7B for 5 MHz capacitance of ~0.1 nF) shows that capacitance of AlOx is 70 times larger than $Al_2O_3$ for the described PPC. Supercapacitance performance of these capacitors increases with increasing bias voltage e.g., C-f plot for 2V bias voltage and for value 5 MHz frequency value C reaches to 60 nF which is capacitance is 60/0.1=600 times higher e.g., ~54 mF/mm3 by comparing PPC's with $AlOx/Al_2O_3$.

Since confined electrons are immobile, but vacancies are mobile, dipole moment vector p→ of the dipoles is a same direction with E→, and increases with increasing electrical field by movement of vacancies in the field direction, so the capacitance increases with increasing electrical field. Dipole model explains varactor as well supercapacitor performances of capacitors.

Oxygen vacancies and confined electrons makes a capacitor not only a supercapacitor but also creates a negative capacitance region where capacitance decreases with increasing frequency. In this unique negative capacitance C-f region, the capacitor behaves like a semiconductor and capacitive reactance, $Xc=1/2\pi fC$, stays nearly constant and even decreases, to compensate lost in the system. In this C-f region the supercapacitor is a tunable supercapacitor with minimum loss and High Q quality factor.

Active capacitor is a plasmonic capacitor:

Suggested herein is a physical model, of an electrical spring, to explain low frequency, room temperature negative capacitance performance, electrical field dependent supercapacitor to superconductor transitions at critical frequencies. The model is a one edge fixed electrical spring, with confined electrons located at the fixed edge and positively charged vacancies at the movable edge of the springs. Coulombic attraction between opposite charges holds springs closer and electrical field pools positively charged vacancies in field direction so apart from confined electrons. Closest distance between charges is the closest-distance-limit of the springs and corresponding spring force make vacancies immobile. This corresponds to electrical insulator mode of the capacitor. When applying an electrical field with increasing strength, a dipole moment p→ of dipoles increases until recalling spring force cannot accommodate the dipole strength. Beyond that critical field and critical frequencies, positively charged vacancies become free and the super insulator transforms to a super conductor. Strong frequency dependence of the capacitor from insulator to conductor transitions where material properties changes from insulator to conductor, at that critical frequency, where plasmonic resonance occurs strongly suggests that AlOx* is a plasmonic medium. Plasmonic effects were observed in AlOx* at optical frequencies e.g., ~Exp 14 Hz (~550 nm mid of visible). See FIG. 9 and radio frequencies (See FIGS. 10A and B) e.g., at 4 KHz to 150 MHz capacitor switches from insulator to conductor. Reverse colossal permittivity explanation up to 1,000000 in picosecond time is not a good explanation. Aluminum nanoparticles involvement plus dipole density-dipole distance of AlOx* plasmonic medium controls resonance frequencies of switching. Resonance frequency of a medium is a specific performance like conductivity, permittivity and/or specific capacitance of that medium. Bias voltage dependent shifting of the resonance frequencies indicates electric field reorganizes of medium and change vacancy distribution therein. The described capacitors are optical resonators in THz or resonators for GHz, MHz, KHz regions.

Oxygen vacancies and metallic nanoparticles comprising AlOx films exhibiting plasmonic performance; in a capacitive form, it is a plasmonic capacitor exhibiting voltage and frequency dependent super-insulator to super-conductor transitions. It is a tunable supercapacitor exhibiting bias voltage and frequency dependent electrical performances. A physical model is suggested to explain observed optical and electrical characteristics.

Summary of Optical and Capacitive Performance of Metamaterial Plasmonic AlOx* Films.

The faster the deposition rate of Al in the same vacuum conditions forms oxygen deficient AlO*x films having oxygen vacancies and may be even metallic Al nanoparticles form in it. FIG. 3B shows unit cell transitions from $Al_2O_3$ to AlOx by losing oxygen. AlO*x films optically are still transparent having light to darker gray tinted films. Spectral transmittance and reflectance such deeper gray film are shown in FIG. 8. Optical performance of Stoichiometric $Al_2O_3$ films given in FIG. 7A having ~90% transmission and ~10% reflectance, are very different that of AlO*x films shown in FIG. 7A. $Al_2O_3$ films are very transparent and exhibit flat T and R % spectra but AlO*x film are highly absorbing exhibiting a 48% maximum transmission and near zero reflectance at ~550 nm. This near zero reflectance and near zero refractive index indicates this composition and structure of AlO*x film is a metamaterial referred to as an epsilon near zero material. The coated surface may be a wavelength selective absorbing metasurface. ENZ materials are known as plasmonics that are metal nanoparticle comprising dielectric composites. In the present case, oxygen vacancies and metallic nanoparticles comprising AlO*x film show ENZ performance. A unit cell of such a composite structure is shown in FIG. 3B. In between $Al_2O_3$ stoichiometric oxide and Al metal rich oxide, there is oxygen vacancy plus metallic nanoparticles comprising Metamaterial Plasmonic-AlO*x. where reflection zero at ENZ condition.

Reflectance spectrum of Plasmonic-AlO*x film exhibit a near zero reflectance in the center of visible region. As seen, yellow light 550-600 nm is absorbed by the coating but the rest of the spectrum are reflected. Materials with near zero effective permittivity of a composite material that would create band gaps in a wide range of frequencies up to the visible. The physical realization of these materials is that the existence of metallic nanoparticles, nanowires create negative effective permittivity conditions.

Plasmonics are epsilon near zero ENZ materials specifically heavily doped semiconductors, transparent conductors are sandwiched composites.

In the present case of plasmonic AlO*x films with near zero reflectance is a plasmonic material having a negative refractive index and negative permittivity at 600 nm (500 THz) (=5 Exp 14 Hz). Spectral performance of plasmonic-AlO*x film depends on particle-size, concentration, distance between particles and film thickness. 80 nm thick AlO*x ENZ film exhibit resonance absorption at 600 nm. The rest of spectrum is reflected from this film except 600 nm. As thinner films are used, the absorbed wavelength shifts to higher energies, showing blue shifts to UV. The present disclosure describes how to make a large area plasmonic metasurface film from oxygen deficient oxides like Al nanoparticle and oxygen vacancy comprising Aluminum oxide. More generally any dielectric medium comprising nanoparticles of a good conductor like Ag, Cu, Al, Au, Pt, oxide forms a plasmonic medium in appropriate composition. The present disclosure focuses primarily on Aluminum mono-oxides.

Figure 11A:
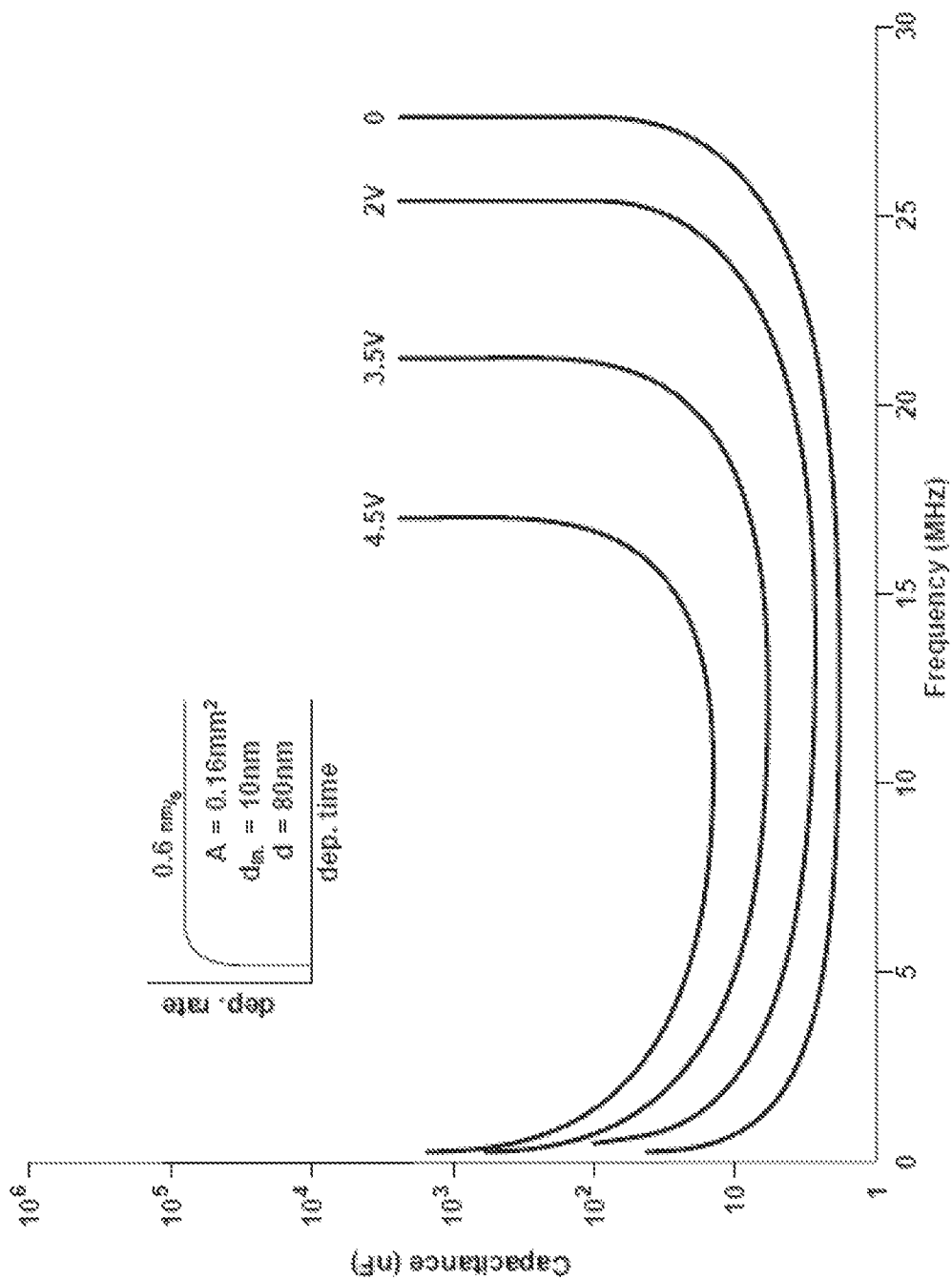
FIG. 11A shows an area-dependent capacitance spectra of plasmonic capacitors.
Figure 11B:
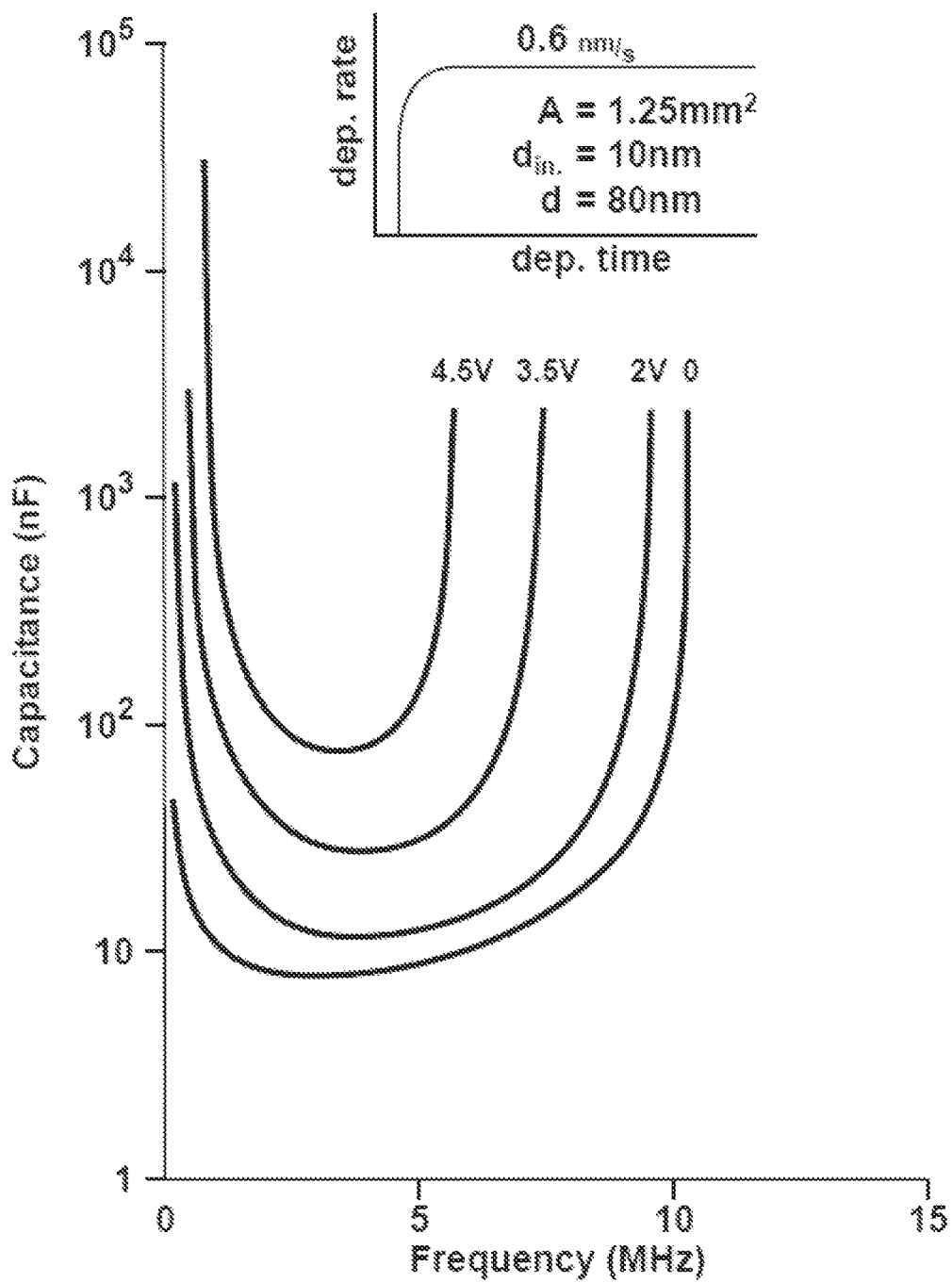
FIG. 11B shows an area-dependent capacitance spectra of plasmonic capacitors.

It is shown that Plasmonic metamaterial AlO*x has an optically negative refractive index and ENZ material. A metamaterial plasmonic PPAlO*x capacitor is proposed and will evaluate DC and RF performance of the capacitors. Capacitance spectra of the capacitors are strongly area dependent; the smaller the area the more frequency span observed. FIGS. 11A and 11B show area dependent capacitance spectra of plasmonic capacitors.

A voltage and frequency-controlled resonator-supercapacitor is described, a plasmonic capacitor, exhibiting voltage and frequency-controlled insulator to conductor transitions in 500 THz optical region, as well as in KHz to MHz electronic frequency regions. These resonance absorption-transitions are tunable by changing Ox to Ox* compositional parameters of oxide plus geometrical parameters of capacitor, such as surface area and thickness of the oxide capacitor.

FIG. 10A shows a schematic capacitance comparison of parallel plate capacitive performance of $Al_2O_3$ and plasmonic AlOx* capacitors. Both capacitors have about same volume of Exp-9 cm3. Base capacitance C(base) of $Al_2O_3$ capacitor has a frequency independent flat capacitance region with C(base)=0.1 nF. Then capacitance increase sharply into a positive capacitance region. Bias voltage does not change capacitive performance of this passive capacitor.

In the present case of plasmonic AlO*x films with near zero reflectance is a plasmonic material having a negative refractive index and negative permittivity at 600 nm (500 THz) (=5 Exp 14 Hz). Spectral performance of plasmonic-AlO*x film depends on particle-size, concentration, distance between particles and film thickness. 80 nm thick AlO*x ENZ film exhibit resonance absorption at 600 nm. The rest of spectrum is reflected from this metasurface film except selectively absorbed 600 nm. Thinner the film absorbed wavelength shows blue shifts at UV. This work describes how to make a large plasmonic film from oxygen deficient oxides like Al nanoparticle and oxygen vacancy Aluminum oxide. More generally any dielectric medium, including $Al_2O_3$, comprising nanoparticles of a good conductor like Ag, Cu, Al, Au, Pt, oxide forms a plasmonic medium in appropriate circumstances. Selective absorption wavelengths will be different for selected oxide host medium and metallic inclusions.

In this work only one material, mono-oxides of Al, were extensively used. It is shown that plasmonic metamaterial AlO*x is optically negative refractive index and ENZ material. A metamaterial plasmonic PPAlO*x capacitor is described and will evaluate DC and RF performance of the capacitors. Capacitance spectra of these capacitors are strongly area dependent; smaller the area more frequency span observed. FIG. 10A shows schematic capacitance spectrum of plasmonic capacitor and comparing it with that of $Al_2O_3$ capacitor.

FIGS. 10A and B show five frequency zones of conductor-semiconductor-insulator-conductor transitions of an active plasmonic capacitor for "zero bias" and 2 Volt bias conditions. FIG. 10 shows bias voltage actively controls frequency zones of the capacitor.

A voltage and frequency-controlled resonator-supercapacitor is shown herein, and a plasmonic capacitor, exhibits voltage and frequency-controlled insulator to conductor transitions in 500 THz optical region, as well as in KHz to MHz electronic frequency regions. These resonance absorption-transitions are voltage-tunable for a given capacitor or changing Ox to Ox* compositional parameters of oxide plus geometrical parameters of capacitor, such as surface area and thickness of the oxide capacitor.

FIG. 10A shows a schematic capacitance comparison of parallel plate capacitance $Al_2O_3$ and plasmonic AlOx* capacitors. Both capacitors have about the same volume of base capacitance.

Base capacitance of C(base) of the $Al_2O_3$ capacitor has a frequency independent flat capacitance region with C(base) =0.1 nF. Then capacitance increases sharply into a positive capacitance region. Bias voltage does not change capacitive performance of this passive capacitor.

| Spectral region | Frequency Range (Hz) | Wavelength Range |
|---|---|---|
| Visible | 4-7.5 * $10^{14}$ | 750 nm-400 nm |
| Near-infrared | 1 * $10^{14}$-4 * $10^{14}$ | 2.5 μm-750 nm |

Table I. Frequency and corresponding wavelength Table. Values in the table can be calculated using c(m/s)=f(Hz) λ(m) equation. Where c=3 Exp 8 m/sec, f is frequency and λ is wavelength.

If top electrode of the plasmonic capacitor is transparent for visible light, the AlO*x can be illuminated through transparent electrode by 600 nm laser (500 THz) light activate plasmonic medium to switch it from insulator to conductor like shown in FIGS. 10A and B. Transparent electrode may be a very thin metal like ~10 nm gold, or TCO (transparent conductive oxide). The capacitor may be illuminated from the transparent electrode side and reflected light may be evaluated. When bias is applied to the electrodes of the capacitor, the resonance frequency changes so color conditions of the reflected light shifts. This system is an "optical capacitor" to evaluate optical frequencies.

FIGS. 11A and 11B show area-dependent capacitance spectra of plasmonic capacitors. All capacitors are 80 nm thick having AlO*x oxide but different area. E.g., A=0.16 mm2 (as shown in FIG. 11A); A=1.25 mm2 (as shown in FIG. 11B).

FIG. 11 shows that smaller area expends more frequency span; larger the area capacitances shifts to lower frequencies.

Supercapacitors' performances are given by specific values such as Definition of Specific performance of a capacitor e.g., specific capacitance given by =C/volume=C/A.d (F/m3) or C/weight of unit volume (F/g). Specific Energy density (Whig), Power density (W/g). Density of $Al_2O_3$=3.95 g/cm3. Low density of aluminum oxide has advantages because of capacitor with high specific charge storage capabilities comparing with other oxides. E.g., A=0.16 mm2 and d=80 nm thick capacitor having C=70 nF capacitance shown in FIG. 10A for zero bias case. Specific capacitance of this capacitor is Csp=70 nF/0.16 mm2×80 nm=5.4 mF/mm3. Zero bias Capacitance of 1.28 mm3 volume of AlO*x capacitor has 5.4 mF. For 2V bias conditions C increase ~10 times so specific capacitance C(2V)=54 mF/mm3. This is an incredibly high capacitance value for a tiny capacitor. The self-capacitance of Earth is approximately 710 µF (0.71 mF), assuming the free-space dielectric to be a vacuum. The capacitance of Mars is 378 µF (0.378 mF)

Example I This example shows when capacitor does not have $Al_2O_3$ insulating interface layer. Capacitor w/o $Al_2O_3$ insulating layer is a resistive switch.

Figure 12:
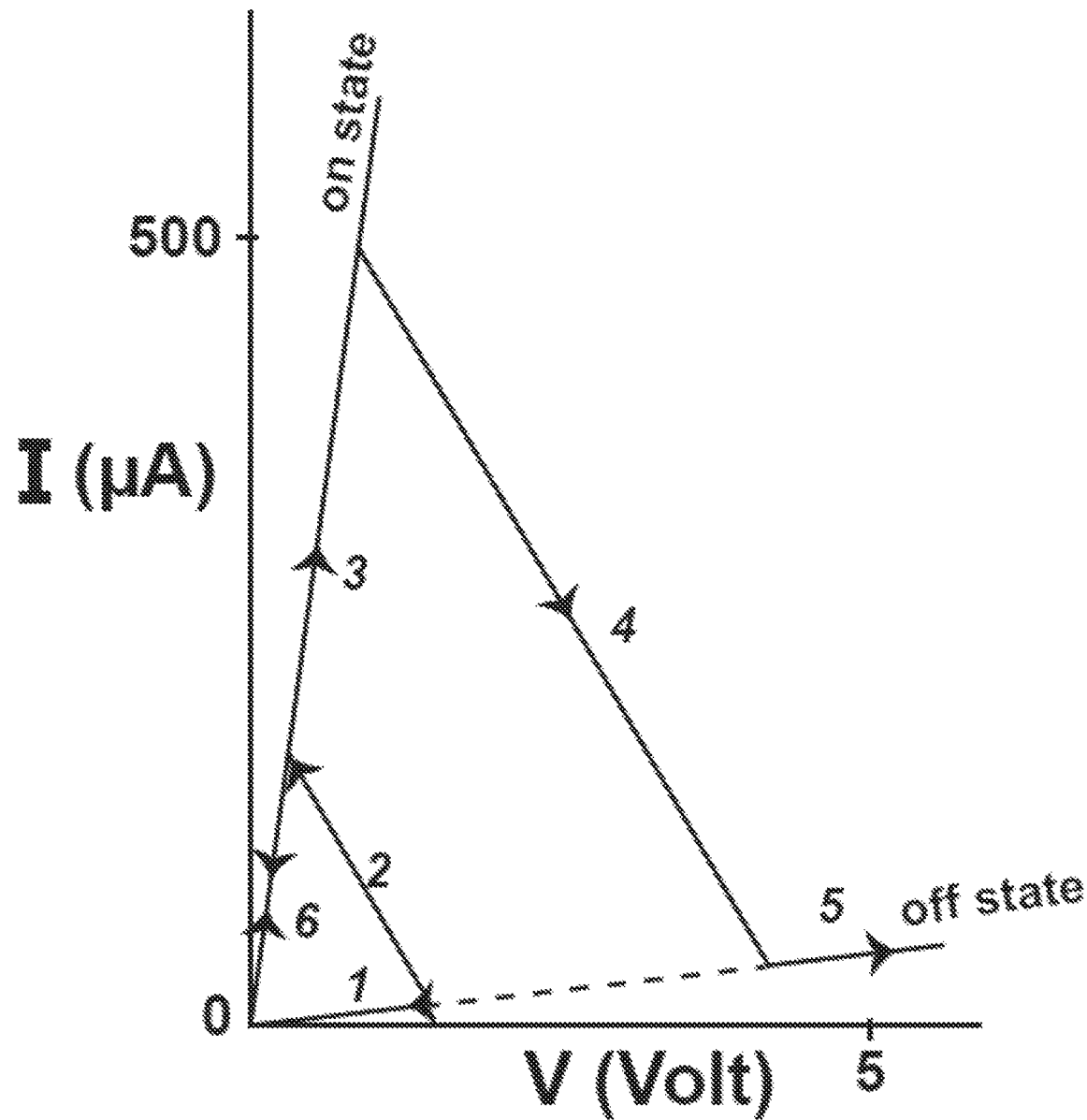
FIG. 12 shows a filamentary type resistive switching performance of a plasmonic capacitor.

FIG. 12 shows filamentary type resistive switching performance of plasmonic capacitors. This capacitor does not have an insulator layer. In current-voltage evaluation shows that as deposited state Capacitor is in Off State so, very low current pass through up to voltage reaches a switching voltage level, capacitor switches from off state on state by forming conductive path, filaments, between electrodes. The switching voltage is around 2-3 V for 80 nm thick capacitor but ~0.5V for 30-40 nm thick oxide capacitor. From on to off state transition occurs when current reaches a filament rupturing level.

Example II. This example shows importance of gradient layer shape and thickness and how those have an effect on "negative capacitance region" of a capacitor. A sharper interface region e.g., 10 nm, makes a narrower negative capacitance region e.g., ~10 MHz, (See FIG. 13A) while increasing the thickness of gradient region e.g, ~3× gradient region of interface, negative capacitance region increases 3× e.g., 30 MHz, (See FIG. 13B), which has an effect on negative capacitance region and supercapacitance performance of capacitors, since negative capacitance region is no loss or low loss.

Figure 13A:
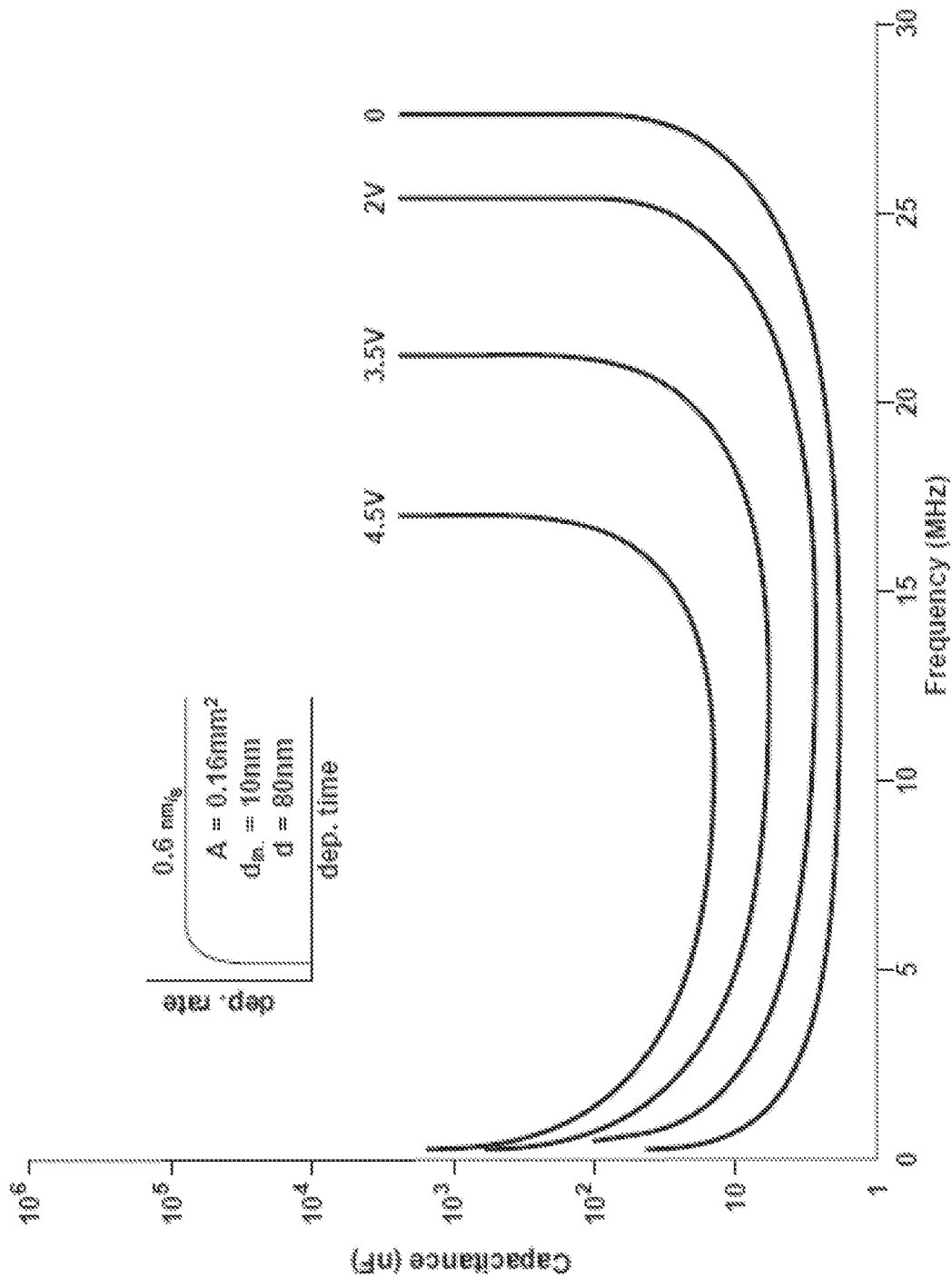
FIG. 13A shows how a capacitor's capacitance varies based on frequency.
Figure 13B:
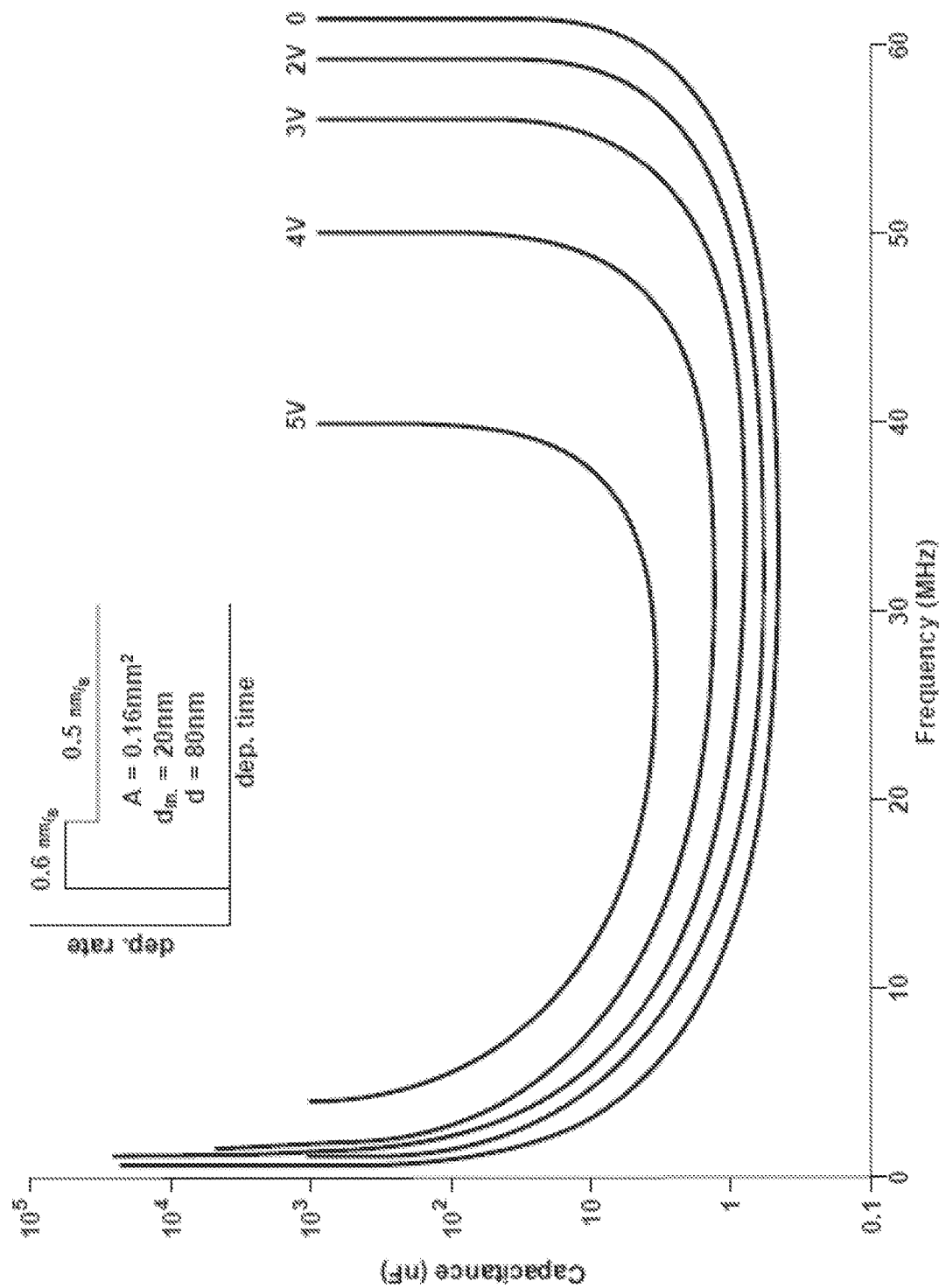
FIG. 13B shows how a capacitor's capacitance varies based on frequency.

FIGS. 13A and 13B shows gradient region of oxide film how effect on negative capacitance semiconductor region.

Figure 14:
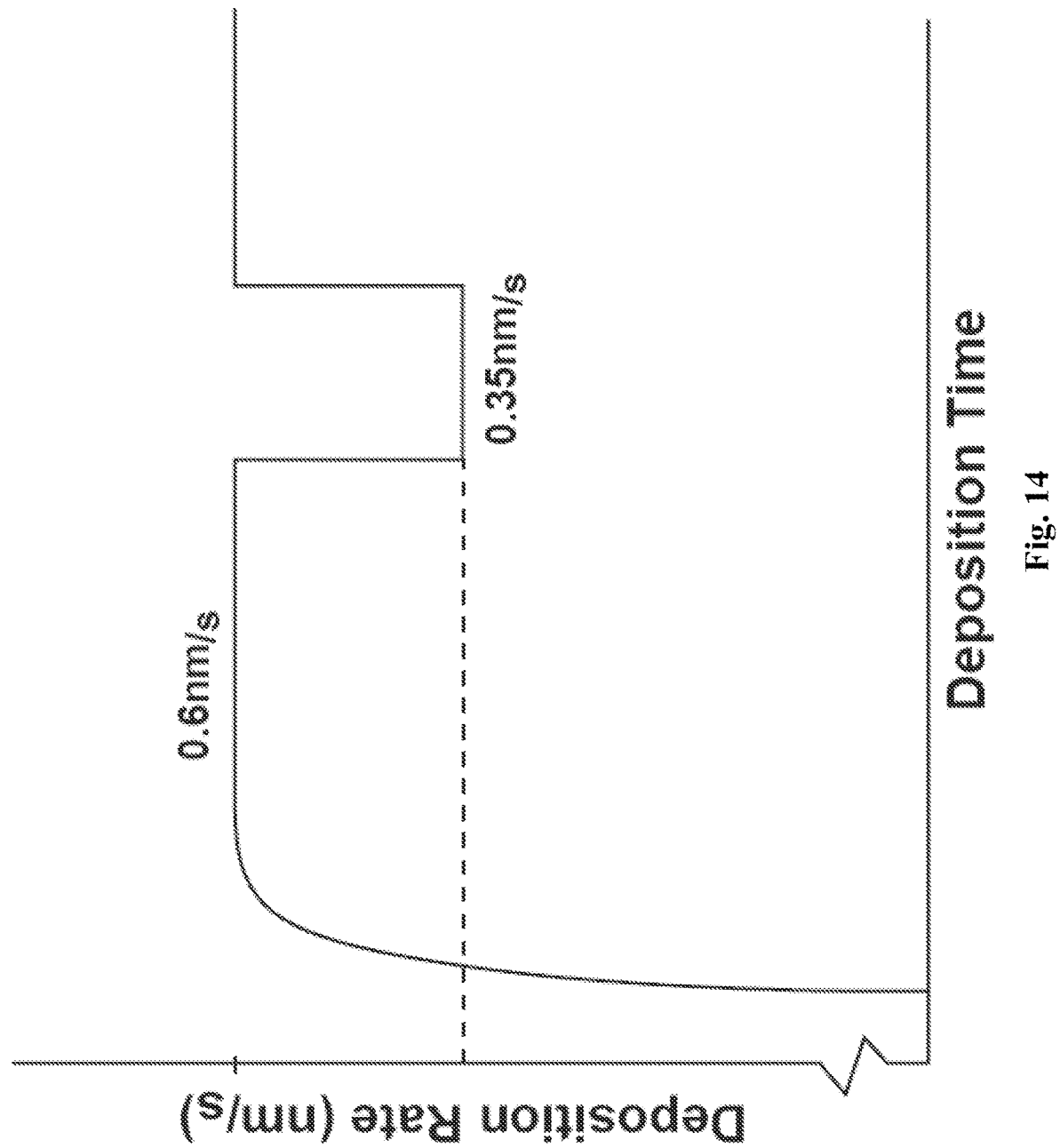
FIG. 14 shows a deposition rate of a thin film.

Example III. FIG. 14 shows constant vacancy region deposition rate profile how controls voltage-controlled performance of plasmonic capacitors.

Example III. This example shows constant vacancy level, deposition rate profile and vacancy concentration how effect on active capacitor performance. In FIG. 2 a deposition rate and resulting active film capacitive performance region is shown. This example explains that if this profile is changed in the middle of a run but by keeping electrode interfaces are the same. Result is if the deposition rate of oxide is reduced to <0.45 4 m/s the middle of run (See FIG. 14) capacitor is not voltage controllable and is just a passive capacitor. An active capacitor needs appropriate vacancy concentration so vacancies can provide hopping conductance.

Summary of parallel-plate plasmonic AlOx* capacitor performance:

The parallel-plate plasmonic AlOx* capacitor is a supercapacitor having specific capacitance of, in one example, 5.4 mF/mm3 for zero bias and ~54 mF/mm3 for 2V bias case.

The parallel-plate plasmonic AlOx* capacitor is a voltage-controlled supercapacitor.

The parallel-plate plasmonic AlOx* capacitor is a tunable supercapacitor varactor.

The parallel-plate plasmonic AlOx* capacitor is a frequency controlled resistive switch in multiple resonance frequencies The parallel-plate plasmonic AlOx* capacitor has a unique negative capacitance region, where capacitor generates electric field and frequency dependent energy that compensates resistive-inductive losses.

The parallel-plate plasmonic AlOx* capacitor is a frequency controlled tunable super capacitor.

A permittivity of $Al_2O_3$ oxide is around 10 in flat region of PPO capacitor. In low frequency, at negative capacitance region of plasmonic oxide permittivity sharply increase so corresponding capacitive reactance goes to zero. Metamaterial plasmonic capacitor becomes a resistor. This epsilon near zero (ENZ) resonance frequency of plasmonic oxide in low frequency is from 500 to 5000 KHz region. Similar dielectric to conductor transition occurs at high frequencies in 20-100 MHz in the positive capacitance region.

In the optical region, 1 to 100 THz, capacitive performance can be observed by using transparent substrate and transparent electrode in the PPOx*C and light source in state of RF source.

This Optical plasmonic capacitor will be a futuristic extremely fast wireless communication tool around 0.01 psec second (1× Exp–14 sec). NB: 1 Hz=1/sec Metamaterial plasmonic capacitor is a frequency controlled resistive switch Switching frequency shift to higher frequencies in Negative capacitance region and lower frequencies in the positive capacitance region by increasing bias voltage.

Metamaterial oxide capacitor is a frequency-controlled RAM (random access memory) element at low frequency (500- to 5000 KHz) and at medium frequency (20 to 150 MHz and at high frequency (5 to 500 THz) optical region).

A layering scheme of: substrate/Al/AlOx*/Au forms a reflective Perrot-Fabry resonator—an optical capacitor. Where highly transparent Au electrode around 10 nm and thick ~90% reflective, an Al electrode under bias and λ (THz) electrical field influence can use extra fast active optical telecommunications.

PP capacitor with AlO*x oxide exhibits a mainly five C-f regions; as frequency increases a resonance region where capacitor switches to a conductor, a negative capacitance region where capacitance decreases with increasing frequencies, which is a semiconductor region and a flat capacitance region where capacitance is independent with frequencies where it is an insulator, and a positive capacitance region, where capacitance increases with increasing frequencies in this semiconductor region and a resonance region where capacitor switches from semiconductor to conductor. Both low frequency edge of negative capacitance region and high frequency edge of positive capacitance region capacitance go to infinity so insulator to resistor switching occurs (see FIG. 10B). Negative capacitance region of AlO*x capacitor is created by as deposited dipoles, formed by positively charged vacancy an confined electrons. More closely graded interface-charge profiled of oxide at bottom electrode. Thicker the gradient region wider the negative capacitance region by shifting to higher frequencies. Besides frequency dependence, AlO*x capacitor exhibits bias voltage dependence when oxygen deficiency x reaches to x* where AlOx* become plasmonic and having ENZ and negative refractive index performance. Both frequency and voltage dependency of AlOx* capacitor indicates that there are DC and RF electric field assisted movable charges exists in it.

This plasmonic AlOx*capacitor is a supercapacitor having specific capacitance of, for example, 5.4 mF/mm3 at zero bias and 54 mF/mm3 for 2V bias case. As deposited capacitor in zero bias condition is a charged capacitor.

Zero bias as deposited Capacitance of AlOx* capacitor increases 70 times by comparing 0.1 nF base capacitance of $Al_2O_3$. Physical performance of AlOx* capacitors changes with frequency indicating that material interact with electromagnetic waves created by RF source as well as the DC electric field created by bias voltages. In the flat region capacitance of AlOx* capacitor material is a dielectric, holding 70× more charge than $Al_2O_3$. When a bias voltage applied to this plasmonic capacitor, top electrode having negative polarity, flat region and whole capacitance spectra moves to higher capacitances, indicating supercapacitor is a voltage controlled variable capacitor; it is a varactor.

FIG. 10B shows both low and high frequency regions capacitance goes to infinity and capacitive reactance goes to zero so the insulator material in the capacitor becomes a conductor. C vs. f plots (e.g., FIGS. 13 A and B) shows frequency and bias voltage dependent physical performance of plasmonic AlOx* film in the capacitor. Between conductive and insulator states of AlOx* film there are two semiconductor phases where material is a tunable supercapacitor. In negative capacitance-semiconductor region AlOx* is a tunable supercapacitor, (TSC) where capacitance increases with decreasing frequency. When f=fsw resonance frequency applied to capacitor vibrating internal charges under influence of applied switching frequency fsw material absorb that frequency and switch to conductive phase. In the negative capacitance region polarization of internal charges increase with decreasing frequency indicating that capacitive lost compensated with internal polarization. In the positive capacitance region polarization of internal charges increases with increasing frequency where capacitor has high capacitive reactance.

Both ends of negative capacitance and positive capacitance regions frequencies of AlOx* plasmonic capacitor capacitive mode become resistive mode. These fsw switching frequencies can be shifted by bias voltage. Bias voltage make shifts fsw to increasing frequencies in negative capacitance region, while to decrease fsw in positive capacitance region. These changes indicate both bias related DC electrical field and RF related AC field and charge movement induced magnetic fields effects permittivity of medium. Reversal polarity put the capacitor original conditions.

FIG. 10A shows a schematic capacitive performance of PPO* plasmonic capacitor $V_b$=0 and $V_b$ bias voltage condition.

AlOx capacitor exhibits a mainly five C-f regions; a negative capacitance region where capacitance decreases with increasing frequencies, and a flat capacitance region where capacitance is independent with frequencies, and a positive capacitance region, where capacitance increases with increasing frequencies. Both low frequency edge of negative capacitance region and high frequency edge of positive capacitance region capacitance go to infinity so insulator to resistor switching occurs. Negative capacitance region of AlO*x capacitor is created by as deposited dipoles, formed by positively charged vacancy an confined electrons. More closely graded interface-charge profiled of oxide at bottom electrode. Thicker the gradient region wider the negative capacitance region by shifting to higher frequencies. Besides frequency dependence, AlO*x capacitor exhibits its bias voltage dependence when oxygen deficiency x reaches to x* where AlOx* become plasmonic and having ENZ and negative refractive index performance. Both frequency and voltage dependency of AlOx* capacitor indicates that there are DC and RF electric field assisted movable charges exists in it.

This plasmonic AlOx*capacitor is a supercapacitor. As deposited capacitor in zero bias condition is a charged capacitor.

Zero bias as deposited Capacitance of AlOx* capacitor increases 70 times by comparing 0.1 nF base capacitance of $Al_2O_3$. Physical performance of AlOx* capacitors changes with frequency indicating that material interact with electromagnetic waves created by RF source as well as the DC electric field created by bias voltages. In the flat region capacitance of AlOx* capacitor material is a dielectric, holding 70× more charge than $Al_2O_3$. When a bias voltage applied to this plasmonic capacitor, top electrode having negative polarity, flat region and whole capacitance spectra moves to higher capacitances, indicating supercapacitor is a voltage controlled variable capacitor; it is a varactor.

Both low and high frequency regions capacitance goes to infinity and capacitive reactance goes to zero so the insulator material in the capacitor become conductor. FIGS. 10A and B. shows frequency and bias voltage dependent physical performance of plasmonic AlOx* film in the capacitor. Between conductive and insulator states of AlOx* film there are two semiconductor phases where material is a tunable supercapacitor. In negative capacitance-semiconductor region AlOx* is a tunable supercapacitor, (TSC) where capacitance increase with decreasing frequency. When f=fsw resonance frequency applied to capacitor vibrating internal charges under influence of applied switching frequency fsw material absorb that frequency and switch to conductive phase. In the negative capacitance region polarization of internal charges increase with decreasing frequency indicating that capacitive lost compensated with internal polarization. In the positive capacitance region polarization of internal charges increases with increasing frequency where capacitor has high capacitive reactance.

Both ends of negative capacitance and positive capacitance regions frequencies of AlOx* plasmonic capacitor capacitive mode become resistive mode. These fsw switching frequencies can be shift by bias voltage. Bias voltage make shifts fsw to increasing frequencies in negative capacitance region, while to decrease fsw in positive capacitance region. These changes indicates both bias related DC electrical field and RF related AC field and charge movement induced magnetic fields effects permittivity of medium. Reversal polarity put the capacitor original conditions.

Optics and Capacitive Performance of Metamaterial Plasmonic AlOx* Films.

Faster the deposition rate of Al in same vacuum conditions forms oxygen deficient AlO*x films having oxygen vacancies and may be even metallic Al nanoparticles form in it. FIG. 3B shows unit cell transitions from $Al_2O_3$ to AlOx by losing oxygen. AlO*x films optically are still transparent having light to darker gray tinted films. Spectral transmittance and reflectance such deeper gray film are shown in FIG. 8. Optical performance of Stoichiometric $Al_2O_3$ films given in FIG. 7A having ~90% transmission and ~10% reflectance, are very different that of AlO*x films shown in FIG. 9. $Al_2O_3$ films are very transparent and exhibit flat T and R % spectra but AlO*x film are highly absorbing exhibiting a 48% maximum transmission and near zero reflectance at ~550 nm. This near zero reflectance and near zero refractive index, indicates this composition and structure of AlO*x film is a metamaterial called epsilon near zero, ENZ, material. ENZ materials are known as plasmonics that are metal nanoparticle comprising dielectric composites. In our case oxygen vacancy and metallic nanoparticles comprising AlO*x film show ENZ performance and it forms a wavelength/frequency selective absorbing surface. Unit cell of such composite structure shown in FIG. 3bi. In between $Al_2O_3$ stoichiometric oxide and Al metal rich oxide, there is oxygen vacancy plus metallic nanoparticles comprising Metamaterial Plasmonic-AlO*x. where reflection zero at ENZ condition.

FIG. 8 Spectral reflectance and transmittance plots of metamaterial. A plasmonic AlO*x film. Figure shows R (%) and T (%) intensities in λ (nm) and f (Hz) scales. Reflectance reaches near zero around 600 nm R=0.2%, corresponding 500 THz indicated on the Figure in THz scale and wavelength scale, nm. Table I. shows visible (Vis) and near infrared (NIR) conversion. This conversion can be calculated electromagnetic wave velocity in vacuum c(m/s)=f (Hz) λ(m).

Reflectance spectrum of Plasmonic-AlO*x film exhibit a near zero reflectance in the center of visible region. As shown, yellow light 550-600 nm is absorbed by the coating but the rest of the spectrum are reflected. Materials with near zero effective permittivity of a composite material that would create band gaps in a wide range of frequencies up to the visible. The physical realization of these materials is that the existence of metallic nanoparticles, nanowires create negative effective permittivity conditions.

What is claimed is:

1. A capacitor comprising:
   a substrate;
   a first electrically conductive electrode layer contacting the substrate;
   a metal oxide layer contacting the first electrically conductive electrode layer, the metal oxide layer further comprising;
      a proximal region of the metal oxide, the proximal region comprising a stoichiometric, dielectric, oxygen vacancy-free portion of the metal oxide, the proximal region in contact with the first electrically conductive electrode layer;
      a distal region of the metal oxide, the distal region comprising a constant oxygen vacancy portion, the distal region in contact with a second electrically conductive electrode layer; and
      a gradient region of the metal oxide disposed between the proximal region and the distal region, wherein the gradient region comprises a substantially stoichiometric metal oxide portion in contact with the proximal region, wherein the gradient region comprises a substantially constant oxygen vacancy portion in communication with the distal region, the gradient region comprising an increasing oxygen vacancy gradient from the portion in communication with the proximal region to the portion in communication with the distal region; and
   wherein the second electrically conductive electrode layer is deposited on the distal region of the metal oxide and in contact with the distal region of the metal oxide.

2. The capacitor of claim 1, wherein the capacitor is made at least in part using a physical vapor deposition (PVD) process, wherein the PVD process comprises at least one of electron-beam PVD, sputtering, atomic layer deposition (ALD), or ion plating.

3. The capacitor of claim 1, wherein the metal oxide layer comprises a plasmonic metamaterial oxide configured to exhibit a variable reflectance of light, wherein the reflectance of a portion of the light is based at least in part on the wavelength of the portion of the light, and wherein the capacitor is configured to reflect the light at a frequency associated with receiving the portion of the light comprising a resonance frequency associated with the metal oxide layer.

4. The capacitor of claim 1, wherein a ratio of oxygen vacancy in the metal oxide is determined at least in part by a deposition rate of the metal oxide during fabrication of the capacitor, and wherein a thickness of the metal oxide layer is determined at least in part by a deposition time during fabrication of the capacitor.

5. The capacitor of claim 4, wherein the oxygen vacancy ratio increases as the deposition rate during fabrication of the capacitor increases, and wherein the oxygen vacancy ratio decreases as the deposition rate during fabrication of the capacitor decreases.

6. The capacitor of claim 1, wherein an oxygen vacancy comprises a positively charged oxygen portion and a negatively charged electron portion, wherein the oxygen portion and the electron portion form a dipole.

7. The capacitor of claim 1, wherein the metal oxide is at least one of Aluminum oxide, Nickel oxide, Tungsten oxide, Titanium oxide, Copper oxide, Tantalum oxide, or Cobalt oxide.

8. The capacitor of claim 1, wherein the stoichiometric metal oxide is $Al_2O_3$.

9. The capacitor of claim 1, wherein applying at least one of a direct current, an alternating current, or a radio frequency electric field to the capacitor causes a force to be applied to the oxygen vacancies.

10. The capacitor of claim 1, wherein the capacitor is a plasmonic oxide capacitor.

11. The capacitor of claim 1, wherein the distal region of the metal oxide layer is configured to act as an epsilon near zero (ENZ) material, wherein, based on a change in voltage applied to the capacitor, a reflectance associated with the ENZ material changes with respect to at least one wavelength of electromagnetic radiation, and wherein the capacitor is configured to operate as an optical communications module based on the change of reflectance.

12. The capacitor of claim 1, wherein, based on a frequency of an alternating current applied to the capacitor, the metal oxide layer switches from an insulator to a conductor, and wherein the metal oxide layer switches from the insulator to the conductor based at least in part on a frequency of the alternating current substantially matching a resonance frequency associated with the metal oxide layer.

13. The capacitor of claim 1, wherein the capacitor is configured to operate as a varactor, further comprising;
   in response to receiving a first applied voltage, cause the capacitor to exhibit a first capacitance; and
   in response to receiving a second applied voltage, cause the capacitor to exhibit a second capacitance, wherein the difference between the first capacitance and the second capacitance is associated with a density of oxygen vacancy associated with the distal region.

14. The capacitor of claim 1, wherein the capacitor comprises a vacuum deposited thin film lightweight solid-state inorganic parallel plate oxide capacitor.

15. The capacitor of claim 1, further comprising a super-capacitor formed based at least in part on dipoles associated with the metal oxide, wherein a first portion of the dipole is associated with an oxygen vacancy, and wherein a second portion of the dipole is associated with at least one electron.

16. The capacitor of claim 1, wherein the gradient region further comprises causing formation of a negative capacitance high quality-factor tunable semiconductor region.

17. A method comprising:
depositing, on a substrate, a first electrically conductive electrode layer;
depositing, on at least one of the substrate or the first electrically conductive electrode layer, a metal oxide layer, the metal oxide layer further comprising:
a proximal region of the metal oxide, the proximal region comprising a stoichiometric, dielectric, oxygen vacancy-free portion of the metal oxide, the proximal region in communication with the first electrically conductive electrode layer;
a distal region of the metal oxide, the distal region comprising a constant oxygen vacancy portion, the distal region in communication with a second electrically conductive electrode layer; and
a gradient region of the metal oxide disposed between the proximal region and the distal region, wherein the gradient region comprises a substantially stoichiometric metal oxide portion in communication with the proximal region, wherein the gradient region comprises a substantially constant oxygen vacancy portion in communication with the distal region, the gradient region comprising an increasing oxygen vacancy gradient from the portion in communication with the proximal region to the portion in communication with the distal region; and
depositing, on at least one of the substrate or the distal region of the metal oxide layer, the second electrically conductive electrode layer.

18. The method of claim 17, further comprising making the capacitor using a physical vapor deposition (PVD) process, wherein the PVD process comprises at least one of electron-beam PVD, sputtering, atomic layer deposition (ALD), or ion plating.

19. The method of claim 17, wherein the ratio of oxygen vacancy in the metal oxide is controlled at least in part by a deposition rate of the metal oxide, and wherein the thickness of the metal oxide layer is controlled at least in part by the deposition time.

20. The method of claim 19, wherein the oxygen vacancy ratio increases as the deposition rate increases, and wherein the oxygen vacancy ratio decreases as the deposition rate decreases.

21. The method of claim 17, wherein an oxygen vacancy comprises a positively charged oxygen portion and a negatively charged electron portion, wherein the oxygen portion and the electron portion form a dipole.

22. The method of claim 17, wherein the metal oxide is at least one of Aluminum oxide, Nickel oxide, Tungsten oxide, Titanium oxide, Copper oxide, Tantalum oxide, or Cobalt oxide.

23. The method of claim 17, wherein the stoichiometric metal oxide is $Al_2O_3$.

24. The method of claim 17, wherein applying at least one of a direct current, an alternating current, or a radio frequency electric field causes a force to be applied to the oxygen vacancies.

25. The method of claim 17, further comprising causing a supercapacitor to be formed based at least in part on dipoles associated with the metal oxide, wherein a first portion of the dipole is associated with an oxygen vacancy, and wherein a second portion of the dipole is associated with at least one electron.

26. The method of claim 17, wherein the gradient region further comprises causing formation of a negative capacitance high quality-factor tunable semiconductor region.

27. The method of claim 17, wherein the metal oxide layer comprises a plasmonic metamaterial oxide configured to exhibit a variable reflectance of light, wherein the reflectance of a portion of the light is based at least in part on the wavelength of the portion of the light, and wherein the capacitor is configured to reflect the light at a frequency associated with receiving the portion of the light comprising a resonance frequency associated with the metal oxide layer.

28. The method of claim 17, wherein the distal region of the metal oxide layer is configured to act as an epsilon near zero (ENZ) material, wherein, based on a change in voltage applied to the capacitor, a reflectance associated with the ENZ material changes with respect to at least one wavelength of electromagnetic radiation, and wherein the capacitor is configured to operate as an optical communications module based on the change of reflectance.

29. The method of claim 17, wherein, based on a frequency of an alternating current applied to the deposited layers, the metal oxide layer switches from an insulator to a conductor, and wherein the metal oxide layer switches from the insulator to the conductor based at least in part on a frequency of the alternating current substantially matching a resonance frequency associated with the metal oxide layer.

30. The method of claim 17, wherein the deposited layers are configured to operate as a varactor, further comprising;
in response to receiving a first applied voltage, causing the varactor to exhibit a first capacitance; and
in response to receiving a second applied voltage, causing the varactor to exhibit a second capacitance, wherein the difference between the first capacitance and the second capacitance is associated with a density of oxygen vacancy associated with the distal region of the metal oxide.

* * * * *